United States Patent
Shalvi et al.

(10) Patent No.: US 8,234,545 B2
(45) Date of Patent: Jul. 31, 2012

(54) DATA STORAGE WITH INCREMENTAL REDUNDANCY

(75) Inventors: Ofir Shalvi, Ra'anana (IL); Dotan Sokolov, Ra'anana (IL); Eyal Gurgi, Petah-Tikva (IL); Oren Golov, Hod Hasharon (IL); Naftali Sommer, Rishon Le-Zion (IL)

(73) Assignee: Apple Inc., Cupertino, CA (US)

( * ) Notice: Subject to any disclaimer, the term of this patent is extended or adjusted under 35 U.S.C. 154(b) by 1115 days.

(21) Appl. No.: 12/119,069

(22) Filed: May 12, 2008

(65) Prior Publication Data

US 2008/0282106 A1 Nov. 13, 2008

Related U.S. Application Data

(60) Provisional application No. 60/917,649, filed on May 12, 2007, provisional application No. 60/983,950, filed on Oct. 31, 2007, provisional application No. 60/989,812, filed on Nov. 22, 2007.

(51) Int. Cl.
*G06F 11/00* (2006.01)

(52) U.S. Cl. ..................................... 714/768

(58) Field of Classification Search .................. 714/748
See application file for complete search history.

(56) References Cited

U.S. PATENT DOCUMENTS

| | | | |
|---|---|---|---|
| 3,668,631 A | 6/1972 | Griffith et al. |
| 3,668,632 A | 6/1972 | Oldham |
| 4,058,851 A | 11/1977 | Scheuneman |
| 4,112,502 A | 9/1978 | Scheuneman |
| 4,394,763 A | 7/1983 | Nagano et al. |
| 4,413,339 A | 11/1983 | Riggle et al. |
| 4,556,961 A | 12/1985 | Iwahash et al. |
| 4,558,431 A | 12/1985 | Satoh |
| 4,608,687 A | 8/1986 | Dutton |
| 4,654,847 A | 3/1987 | Dutton |
| 4,661,929 A | 4/1987 | Aoki et al. |

(Continued)

FOREIGN PATENT DOCUMENTS

EP 0783754 B1 7/1997

(Continued)

OTHER PUBLICATIONS

Agrell et al., "Closest Point Search in Lattices", IEEE Transactions on Information Theory, vol. 48, No. 8, pp. 2201-2214, Aug. 2002.

(Continued)

*Primary Examiner* — Amine Riad
(74) *Attorney, Agent, or Firm* — Meyertons, Hood, Kivlin, Kowert & Goetzel, P.C.

(57) ABSTRACT

A method for operating a memory includes encoding input data with an Error Correction Code (ECC) to produce input encoded data including first and second sections, such that the ECC is decodable based on the first section at a first redundancy, and based on both the first and the second sections at a second redundancy that is higher than the first redundancy. Output encoded data is read and a condition is evaluated. The input data is reconstructed using a decoding level selected, responsively to the condition, from a first level, at which a first part of the output encoded data corresponding to the first section is processed to decode the ECC at the first redundancy, and a second level, at which the first part and a second part of the output encoded data corresponding to the second section are processed jointly to decode the ECC at the second redundancy.

37 Claims, 5 Drawing Sheets

U.S. PATENT DOCUMENTS

| | | |
|---|---|---|
| 4,768,171 A | 8/1988 | Tada |
| 4,811,285 A | 3/1989 | Walker et al. |
| 4,899,342 A | 2/1990 | Potter et al. |
| 4,910,706 A | 3/1990 | Hyatt |
| 4,993,029 A | 2/1991 | Galbraith et al. |
| 5,056,089 A | 10/1991 | Furuta et al. |
| 5,077,722 A | 12/1991 | Geist et al. |
| 5,126,808 A | 6/1992 | Montalvo et al. |
| 5,163,021 A | 11/1992 | Mehrotra et al. |
| 5,172,338 A | 12/1992 | Mehrotra et al. |
| 5,182,558 A | 1/1993 | Mayo |
| 5,182,752 A | 1/1993 | DeRoo et al. |
| 5,191,584 A | 3/1993 | Anderson |
| 5,200,959 A | 4/1993 | Gross et al. |
| 5,237,535 A | 8/1993 | Mielke et al. |
| 5,272,669 A | 12/1993 | Samachisa et al. |
| 5,276,649 A | 1/1994 | Hoshita et al. |
| 5,287,469 A | 2/1994 | Tsuboi |
| 5,365,484 A | 11/1994 | Cleveland et al. |
| 5,388,064 A | 2/1995 | Khan |
| 5,416,646 A | 5/1995 | Shirai |
| 5,416,782 A | 5/1995 | Wells et al. |
| 5,446,854 A | 8/1995 | Khalidi et al. |
| 5,450,424 A | 9/1995 | Okugaki et al. |
| 5,469,444 A | 11/1995 | Endoh et al. |
| 5,473,753 A | 12/1995 | Wells et al. |
| 5,479,170 A | 12/1995 | Cauwenberghs et al. |
| 5,508,958 A | 4/1996 | Fazio et al. |
| 5,519,831 A | 5/1996 | Holzhammer |
| 5,532,962 A | 7/1996 | Auclair et al. |
| 5,533,190 A | 7/1996 | Binford et al. |
| 5,541,886 A | 7/1996 | Hasbun |
| 5,600,677 A | 2/1997 | Citta et al. |
| 5,638,320 A | 6/1997 | Wong et al. |
| 5,657,332 A | 8/1997 | Auclair et al. |
| 5,675,540 A | 10/1997 | Roohparvar |
| 5,682,352 A | 10/1997 | Wong et al. |
| 5,687,114 A | 11/1997 | Khan |
| 5,696,717 A | 12/1997 | Koh |
| 5,726,649 A | 3/1998 | Tamaru et al. |
| 5,726,934 A | 3/1998 | Tran et al. |
| 5,742,752 A | 4/1998 | De Koning |
| 5,748,533 A | 5/1998 | Dunlap et al. |
| 5,748,534 A | 5/1998 | Dunlap et al. |
| 5,751,637 A | 5/1998 | Chen et al. |
| 5,761,402 A | 6/1998 | Kaneda et al. |
| 5,798,966 A | 8/1998 | Keeney |
| 5,799,200 A | 8/1998 | Brant et al. |
| 5,801,985 A | 9/1998 | Roohparvar et al. |
| 5,838,832 A | 11/1998 | Barnsley |
| 5,860,106 A | 1/1999 | Domen et al. |
| 5,867,114 A | 2/1999 | Barbir |
| 5,867,428 A | 2/1999 | Ishii et al. |
| 5,867,429 A | 2/1999 | Chen et al. |
| 5,877,986 A | 3/1999 | Harari et al. |
| 5,889,937 A | 3/1999 | Tamagawa |
| 5,901,089 A | 5/1999 | Korsh et al. |
| 5,909,449 A | 6/1999 | So et al. |
| 5,912,906 A | 6/1999 | Wu et al. |
| 5,930,167 A | 7/1999 | Lee et al. |
| 5,937,424 A | 8/1999 | Leak et al. |
| 5,942,004 A | 8/1999 | Cappelletti |
| 5,946,716 A | 8/1999 | Karp et al. |
| 5,969,986 A | 10/1999 | Wong et al. |
| 5,982,668 A | 11/1999 | Ishii et al. |
| 5,991,517 A | 11/1999 | Harari et al. |
| 5,995,417 A | 11/1999 | Chen et al. |
| 6,009,014 A | 12/1999 | Hollmer et al. |
| 6,009,016 A | 12/1999 | Ishii et al. |
| 6,023,425 A | 2/2000 | Ishii et al. |
| 6,034,891 A | 3/2000 | Norman |
| 6,040,993 A | 3/2000 | Chen et al. |
| 6,041,430 A | 3/2000 | Yamauchi |
| 6,073,204 A | 6/2000 | Lakhani et al. |
| 6,101,614 A | 8/2000 | Gonzales et al. |
| 6,128,237 A | 10/2000 | Shirley et al. |
| 6,134,140 A | 10/2000 | Tanaka et al. |
| 6,134,143 A | 10/2000 | Norman |
| 6,134,631 A | 10/2000 | Jennings |
| 6,141,261 A | 10/2000 | Patti |
| 6,151,246 A | 11/2000 | So et al. |
| 6,157,573 A | 12/2000 | Ishii et al. |
| 6,166,962 A | 12/2000 | Chen et al. |
| 6,169,691 B1 | 1/2001 | Pasotti et al. |
| 6,178,466 B1 | 1/2001 | Gilbertson et al. |
| 6,185,134 B1 | 2/2001 | Tanaka et al. |
| 6,209,113 B1 | 3/2001 | Roohparvar |
| 6,212,654 B1 | 4/2001 | Lou et al. |
| 6,219,276 B1 | 4/2001 | Parker |
| 6,219,447 B1 | 4/2001 | Lee et al. |
| 6,222,762 B1 | 4/2001 | Guterman et al. |
| 6,230,233 B1 | 5/2001 | Lofgren et al. |
| 6,240,458 B1 | 5/2001 | Gilbertson |
| 6,259,627 B1 | 7/2001 | Wong |
| 6,275,419 B1 | 8/2001 | Guterman et al. |
| 6,278,632 B1 | 8/2001 | Chevallier |
| 6,279,069 B1 | 8/2001 | Robinson et al. |
| 6,288,944 B1 | 9/2001 | Kawamura |
| 6,292,394 B1 | 9/2001 | Cohen et al. |
| 6,301,151 B1 | 10/2001 | Engh et al. |
| 6,304,486 B1 | 10/2001 | Yano |
| 6,307,776 B1 | 10/2001 | So et al. |
| 6,314,044 B1 | 11/2001 | Sasaki et al. |
| 6,317,363 B1 | 11/2001 | Guterman et al. |
| 6,317,364 B1 | 11/2001 | Guterman et al. |
| 6,345,004 B1 | 2/2002 | Omura et al. |
| 6,360,346 B1 | 3/2002 | Miyauchi et al. |
| 6,363,008 B1 | 3/2002 | Wong |
| 6,363,454 B1 | 3/2002 | Lakhani et al. |
| 6,366,496 B1 | 4/2002 | Torelli et al. |
| 6,385,092 B1 | 5/2002 | Ishii et al. |
| 6,392,932 B1 | 5/2002 | Ishii et al. |
| 6,396,742 B1 | 5/2002 | Korsh et al. |
| 6,397,364 B1 | 5/2002 | Barkan |
| 6,405,323 B1 | 6/2002 | Lin et al. |
| 6,405,342 B1 | 6/2002 | Lee |
| 6,418,060 B1 | 7/2002 | Yong et al. |
| 6,442,585 B1 | 8/2002 | Dean et al. |
| 6,445,602 B1 | 9/2002 | Kokudo et al. |
| 6,452,838 B1 | 9/2002 | Ishii et al. |
| 6,456,528 B1 | 9/2002 | Chen |
| 6,466,476 B1 | 10/2002 | Wong et al. |
| 6,467,062 B1 | 10/2002 | Barkan |
| 6,469,931 B1 | 10/2002 | Ban et al. |
| 6,480,948 B1 | 11/2002 | Virajpet et al. |
| 6,490,236 B1 | 12/2002 | Fukuda et al. |
| 6,522,580 B2 | 2/2003 | Chen et al. |
| 6,525,952 B2 | 2/2003 | Araki et al. |
| 6,532,556 B1 | 3/2003 | Wong et al. |
| 6,538,922 B1 | 3/2003 | Khalid et al. |
| 6,549,464 B2 | 4/2003 | Tanaka et al. |
| 6,553,510 B1 | 4/2003 | Pekny et al. |
| 6,558,967 B1 | 5/2003 | Wong |
| 6,560,152 B1 | 5/2003 | Cernea |
| 6,567,311 B2 | 5/2003 | Ishii et al. |
| 6,577,539 B2 | 6/2003 | Iwahashi |
| 6,584,012 B2 | 6/2003 | Banks |
| 6,615,307 B1 | 9/2003 | Roohparvar |
| 6,621,739 B2 | 9/2003 | Gonzales et al. |
| 6,640,326 B1 | 10/2003 | Buckingham et al. |
| 6,643,169 B2 | 11/2003 | Rudelic et al. |
| 6,646,913 B2 | 11/2003 | Micheloni et al. |
| 6,678,192 B2 | 1/2004 | Gongwer et al. |
| 6,683,811 B2 | 1/2004 | Ishii et al. |
| 6,687,155 B2 | 2/2004 | Nagasue |
| 6,707,748 B2 | 3/2004 | Lin et al. |
| 6,708,257 B2 | 3/2004 | Bao |
| 6,714,449 B2 | 3/2004 | Khalid |
| 6,717,847 B2 | 4/2004 | Chen |
| 6,731,557 B2 | 5/2004 | Beretta |
| 6,732,250 B2 | 5/2004 | Durrant |
| 6,738,293 B1 | 5/2004 | Iwahashi |
| 6,751,766 B2 | 6/2004 | Guterman et al. |
| 6,757,193 B2 | 6/2004 | Chen et al. |
| 6,774,808 B1 | 8/2004 | Hibbs et al. |
| 6,781,877 B2 | 8/2004 | Cernea et al. |
| 6,804,805 B2 | 10/2004 | Rub |

| Patent | Type | Date | Inventor(s) |
|---|---|---|---|
| 6,807,095 | B2 | 10/2004 | Chen et al. |
| 6,807,101 | B2 | 10/2004 | Ooishi et al. |
| 6,809,964 | B2 | 10/2004 | Moschopoulos et al. |
| 6,819,592 | B2 | 11/2004 | Noguchi et al. |
| 6,829,167 | B2 | 12/2004 | Tu et al. |
| 6,845,052 | B1 | 1/2005 | Ho et al. |
| 6,851,018 | B2 | 2/2005 | Wyatt et al. |
| 6,851,081 | B2 | 2/2005 | Yamamoto |
| 6,856,546 | B2 | 2/2005 | Guterman et al. |
| 6,862,218 | B2 | 3/2005 | Guterman et al. |
| 6,870,767 | B2 | 3/2005 | Rudelic et al. |
| 6,870,773 | B2 | 3/2005 | Noguchi et al. |
| 6,873,552 | B2 | 3/2005 | Ishii et al. |
| 6,879,520 | B2 | 4/2005 | Hosono et al. |
| 6,882,567 | B1 | 4/2005 | Wong |
| 6,894,926 | B2 | 5/2005 | Guterman et al. |
| 6,907,497 | B2 | 6/2005 | Hosono et al. |
| 6,925,009 | B2 | 8/2005 | Noguchi et al. |
| 6,930,925 | B2 | 8/2005 | Guo et al. |
| 6,934,188 | B2 | 8/2005 | Roohparvar |
| 6,937,511 | B2 | 8/2005 | Hsu et al. |
| 6,958,938 | B2 | 10/2005 | Noguchi et al. |
| 6,963,505 | B2 | 11/2005 | Cohen |
| 6,972,993 | B2 | 12/2005 | Conley et al. |
| 6,988,175 | B2 | 1/2006 | Lasser |
| 6,992,932 | B2 | 1/2006 | Cohen |
| 6,999,344 | B2 | 2/2006 | Hosono et al. |
| 7,002,843 | B2 | 2/2006 | Guterman et al. |
| 7,006,379 | B2 | 2/2006 | Noguchi et al. |
| 7,012,835 | B2 | 3/2006 | Gonzales et al. |
| 7,020,017 | B2 | 3/2006 | Chen et al. |
| 7,023,735 | B2 | 4/2006 | Ban et al. |
| 7,031,210 | B2 | 4/2006 | Park et al. |
| 7,031,214 | B2 | 4/2006 | Tran |
| 7,031,216 | B2 | 4/2006 | You |
| 7,039,846 | B2 | 5/2006 | Hewitt et al. |
| 7,042,766 | B1 | 5/2006 | Wang et al. |
| 7,054,193 | B1 | 5/2006 | Wong |
| 7,054,199 | B2 | 5/2006 | Lee et al. |
| 7,057,958 | B2 | 6/2006 | So et al. |
| 7,065,147 | B2 | 6/2006 | Ophir et al. |
| 7,068,539 | B2 | 6/2006 | Guterman et al. |
| 7,071,849 | B2 | 7/2006 | Zhang |
| 7,072,222 | B2 | 7/2006 | Ishii et al. |
| 7,079,555 | B2 | 7/2006 | Baydar et al. |
| 7,088,615 | B2 | 8/2006 | Guterman et al. |
| 7,099,194 | B2 | 8/2006 | Tu et al. |
| 7,102,924 | B2 | 9/2006 | Chen et al. |
| 7,113,432 | B2 | 9/2006 | Mokhlesi |
| 7,130,210 | B2 | 10/2006 | Bathul et al. |
| 7,139,192 | B1 | 11/2006 | Wong |
| 7,139,198 | B2 | 11/2006 | Guterman et al. |
| 7,145,805 | B2 | 12/2006 | Ishii et al. |
| 7,151,692 | B2 | 12/2006 | Wu |
| 7,158,058 | B1 | 1/2007 | Yu |
| 7,170,781 | B2 | 1/2007 | So et al. |
| 7,170,802 | B2 | 1/2007 | Cernea et al. |
| 7,173,859 | B2 | 2/2007 | Hemink |
| 7,177,184 | B2 | 2/2007 | Chen |
| 7,177,195 | B2 | 2/2007 | Gonzales et al. |
| 7,177,199 | B2 | 2/2007 | Chen et al. |
| 7,177,200 | B2 | 2/2007 | Ronen et al. |
| 7,184,338 | B2 | 2/2007 | Nakagawa et al. |
| 7,187,195 | B2 | 3/2007 | Kim |
| 7,187,592 | B2 | 3/2007 | Guterman et al. |
| 7,190,614 | B2 | 3/2007 | Wu |
| 7,193,898 | B2 | 3/2007 | Cernea |
| 7,193,921 | B2 | 3/2007 | Choi et al. |
| 7,196,644 | B1 | 3/2007 | Anderson et al. |
| 7,196,928 | B2 | 3/2007 | Chen |
| 7,196,933 | B2 | 3/2007 | Shibata |
| 7,197,594 | B2 | 3/2007 | Raz et al. |
| 7,200,062 | B2 | 4/2007 | Kinsely et al. |
| 7,210,077 | B2 | 4/2007 | Brandenberger et al. |
| 7,221,592 | B2 | 5/2007 | Nazarian |
| 7,224,613 | B2 | 5/2007 | Chen et al. |
| 7,231,474 | B1 | 6/2007 | Helms et al. |
| 7,231,562 | B2 | 6/2007 | Ohlhoff et al. |
| 7,243,275 | B2 | 7/2007 | Gongwer et al. |
| 7,254,690 | B2 | 8/2007 | Rao |
| 7,254,763 | B2 | 8/2007 | Aadsen et al. |
| 7,257,027 | B2 | 8/2007 | Park |
| 7,259,987 | B2 | 8/2007 | Chen et al. |
| 7,266,026 | B2 | 9/2007 | Gongwer et al. |
| 7,266,069 | B2 | 9/2007 | Chu |
| 7,269,066 | B2 | 9/2007 | Nguyen et al. |
| 7,272,757 | B2 | 9/2007 | Stocken |
| 7,274,611 | B2 | 9/2007 | Roohparvar |
| 7,277,355 | B2 | 10/2007 | Tanzana |
| 7,280,398 | B1 | 10/2007 | Lee et al. |
| 7,280,409 | B2 | 10/2007 | Misumi et al. |
| 7,280,415 | B2 | 10/2007 | Hwang et al. |
| 7,283,399 | B2 | 10/2007 | Ishii et al. |
| 7,289,344 | B2 | 10/2007 | Chen |
| 7,301,807 | B2 | 11/2007 | Khalid et al. |
| 7,301,817 | B2 | 11/2007 | Li et al. |
| 7,308,525 | B2 | 12/2007 | Lasser et al. |
| 7,310,255 | B2 | 12/2007 | Chan |
| 7,310,269 | B2 | 12/2007 | Shibata |
| 7,310,271 | B2 | 12/2007 | Lee |
| 7,310,272 | B1 | 12/2007 | Mokhlesi et al. |
| 7,310,347 | B2 | 12/2007 | Lasser |
| 7,312,727 | B1 | 12/2007 | Feng et al. |
| 7,321,509 | B2 | 1/2008 | Chen et al. |
| 7,328,384 | B1 | 2/2008 | Kulkarni et al. |
| 7,342,831 | B2 | 3/2008 | Mokhlesi et al. |
| 7,343,330 | B1 | 3/2008 | Boesjes et al. |
| 7,345,924 | B2 | 3/2008 | Nguyen et al. |
| 7,345,928 | B2 | 3/2008 | Li |
| 7,349,263 | B2 | 3/2008 | Kim et al. |
| 7,356,755 | B2 | 4/2008 | Fackenthal |
| 7,363,420 | B2 | 4/2008 | Lin et al. |
| 7,365,671 | B1 | 4/2008 | Anderson |
| 7,388,781 | B2 | 6/2008 | Litsyn et al. |
| 7,397,697 | B2 | 7/2008 | So et al. |
| 7,405,974 | B2 | 7/2008 | Yaoi et al. |
| 7,405,979 | B2 | 7/2008 | Ishii et al. |
| 7,408,804 | B2 | 8/2008 | Hemink et al. |
| 7,408,810 | B2 | 8/2008 | Aritome et al. |
| 7,409,473 | B2 | 8/2008 | Conley et al. |
| 7,409,623 | B2 * | 8/2008 | Baker et al. .................. 714/763 |
| 7,420,847 | B2 | 9/2008 | Li |
| 7,433,231 | B2 | 10/2008 | Aritome |
| 7,433,697 | B2 | 10/2008 | Karaoguz et al. |
| 7,434,111 | B2 | 10/2008 | Sugiura et al. |
| 7,437,498 | B2 | 10/2008 | Ronen |
| 7,440,324 | B2 | 10/2008 | Mokhlesi |
| 7,440,331 | B2 | 10/2008 | Hemink |
| 7,441,067 | B2 | 10/2008 | Gorobetz et al. |
| 7,447,970 | B2 | 11/2008 | Wu et al. |
| 7,450,421 | B2 | 11/2008 | Mokhlesi et al. |
| 7,453,737 | B2 | 11/2008 | Ha |
| 7,457,163 | B2 | 11/2008 | Hemink |
| 7,457,897 | B1 | 11/2008 | Lee et al. |
| 7,460,410 | B2 | 12/2008 | Nagai et al. |
| 7,460,412 | B2 | 12/2008 | Lee et al. |
| 7,466,592 | B2 | 12/2008 | Mitani et al. |
| 7,468,907 | B2 | 12/2008 | Kang et al. |
| 7,468,911 | B2 | 12/2008 | Lutze et al. |
| 7,469,049 | B1 | 12/2008 | Feng |
| 7,471,581 | B2 | 12/2008 | Tran et al. |
| 7,483,319 | B2 | 1/2009 | Brown |
| 7,487,329 | B2 | 2/2009 | Hepkin et al. |
| 7,487,394 | B2 | 2/2009 | Forhan et al. |
| 7,492,641 | B2 | 2/2009 | Hosono et al. |
| 7,508,710 | B2 | 3/2009 | Mokhlesi |
| 7,526,711 | B2 * | 4/2009 | Orio .................. 714/755 |
| 7,539,061 | B2 | 5/2009 | Lee |
| 7,539,062 | B2 | 5/2009 | Doyle |
| 7,551,492 | B2 | 6/2009 | Kim |
| 7,558,109 | B2 | 7/2009 | Brandman et al. |
| 7,558,839 | B1 | 7/2009 | McGovern |
| 7,568,135 | B2 | 7/2009 | Cornwell et al. |
| 7,570,520 | B2 | 8/2009 | Kamei et al. |
| 7,574,555 | B2 | 8/2009 | Porat et al. |
| 7,590,002 | B2 | 9/2009 | Mokhlesi et al. |
| 7,593,259 | B2 | 9/2009 | Kim et al. |
| 7,594,093 | B1 | 9/2009 | Kancherla |

| | | |
|---|---|---|
| 7,596,707 B1 | 9/2009 | Vemula |
| 7,609,787 B2 * | 10/2009 | Jahan et al. .................. 375/341 |
| 7,613,043 B2 | 11/2009 | Cornwell et al. |
| 7,616,498 B2 | 11/2009 | Mokhlesi et al. |
| 7,619,918 B2 | 11/2009 | Aritome |
| 7,631,245 B2 | 12/2009 | Lasser |
| 7,633,798 B2 | 12/2009 | Sarin et al. |
| 7,633,802 B2 | 12/2009 | Mokhlesi |
| 7,639,532 B2 | 12/2009 | Roohparvar et al. |
| 7,644,347 B2 | 1/2010 | Alexander et al. |
| 7,656,734 B2 | 2/2010 | Thorp et al. |
| 7,660,158 B2 | 2/2010 | Aritome |
| 7,660,183 B2 | 2/2010 | Ware et al. |
| 7,661,000 B2 | 2/2010 | Ueda et al. |
| 7,661,054 B2 | 2/2010 | Huffman et al. |
| 7,665,007 B2 | 2/2010 | Yang et al. |
| 7,680,987 B1 | 3/2010 | Clark et al. |
| 7,733,712 B1 | 6/2010 | Walston et al. |
| 7,742,351 B2 | 6/2010 | Inoue et al. |
| 7,761,624 B2 | 7/2010 | Karamcheti et al. |
| 7,797,609 B2 * | 9/2010 | Neuman ..................... 714/758 |
| 7,810,017 B2 | 10/2010 | Radke |
| 7,848,149 B2 | 12/2010 | Gonzalez et al. |
| 7,869,273 B2 | 1/2011 | Lee et al. |
| 7,885,119 B2 | 2/2011 | Li |
| 7,904,783 B2 | 3/2011 | Brandman et al. |
| 7,928,497 B2 | 4/2011 | Yaegashi |
| 7,929,549 B1 | 4/2011 | Talbot |
| 7,930,515 B2 | 4/2011 | Gupta et al. |
| 7,945,825 B2 | 5/2011 | Cohen et al. |
| 7,978,516 B2 | 7/2011 | Olbrich et al. |
| 8,014,094 B1 | 9/2011 | Jin |
| 8,037,380 B2 | 10/2011 | Cagno et al. |
| 8,040,744 B2 | 10/2011 | Gorobets et al. |
| 8,065,583 B2 | 11/2011 | Radke |
| 2001/0002172 A1 | 5/2001 | Tanaka et al. |
| 2001/0006479 A1 | 7/2001 | Ikihashi et al. |
| 2002/0038440 A1 | 3/2002 | Barkan |
| 2002/0056064 A1 * | 5/2002 | Kidorf et al. ................. 714/755 |
| 2002/0118574 A1 | 8/2002 | Gongwer et al. |
| 2002/0133684 A1 | 9/2002 | Anderson |
| 2002/0166091 A1 * | 11/2002 | Kidorf et al. ................. 714/752 |
| 2002/0174295 A1 | 11/2002 | Ulrich et al. |
| 2002/0196510 A1 | 12/2002 | Hietala et al. |
| 2003/0002348 A1 | 1/2003 | Chen et al. |
| 2003/0103400 A1 | 6/2003 | Van Tran |
| 2003/0161183 A1 | 8/2003 | Tran |
| 2003/0189856 A1 | 10/2003 | Cho et al. |
| 2004/0057265 A1 | 3/2004 | Mirabel et al. |
| 2004/0057285 A1 | 3/2004 | Cernea et al. |
| 2004/0083333 A1 | 4/2004 | Chang et al. |
| 2004/0083334 A1 | 4/2004 | Chang et al. |
| 2004/0105311 A1 | 6/2004 | Cernea et al. |
| 2004/0114437 A1 | 6/2004 | Li |
| 2004/0160842 A1 | 8/2004 | Fukiage |
| 2004/0223371 A1 | 11/2004 | Roohparvar |
| 2005/0007802 A1 | 1/2005 | Gerpheide |
| 2005/0013165 A1 | 1/2005 | Ban |
| 2005/0024941 A1 | 2/2005 | Lasser et al. |
| 2005/0024978 A1 | 2/2005 | Ronen |
| 2005/0030788 A1 | 2/2005 | Parkinson et al. |
| 2005/0086574 A1 | 4/2005 | Fackenthal |
| 2005/0121436 A1 | 6/2005 | Kamitani et al. |
| 2005/0144361 A1 | 6/2005 | Gonzalez et al. |
| 2005/0157555 A1 | 7/2005 | Ono et al. |
| 2005/0162913 A1 | 7/2005 | Chen |
| 2005/0169051 A1 | 8/2005 | Khalid et al. |
| 2005/0189649 A1 | 9/2005 | Maruyama et al. |
| 2005/0213393 A1 | 9/2005 | Lasser |
| 2005/0224853 A1 | 10/2005 | Ohkawa |
| 2005/0240745 A1 | 10/2005 | Iyer et al. |
| 2005/0243626 A1 | 11/2005 | Ronen |
| 2006/0004952 A1 | 1/2006 | Lasser |
| 2006/0028875 A1 | 2/2006 | Avraham et al. |
| 2006/0028877 A1 | 2/2006 | Meir |
| 2006/0101193 A1 | 5/2006 | Murin |
| 2006/0106972 A1 | 5/2006 | Gorobets et al. |
| 2006/0107136 A1 | 5/2006 | Gongwer et al. |
| 2006/0129750 A1 | 6/2006 | Lee et al. |
| 2006/0133141 A1 | 6/2006 | Gorobets |
| 2006/0156189 A1 | 7/2006 | Tomlin |
| 2006/0179334 A1 | 8/2006 | Brittain et al. |
| 2006/0190699 A1 | 8/2006 | Lee |
| 2006/0203546 A1 | 9/2006 | Lasser |
| 2006/0218359 A1 | 9/2006 | Sanders et al. |
| 2006/0221692 A1 | 10/2006 | Chen |
| 2006/0221705 A1 | 10/2006 | Hemink et al. |
| 2006/0221714 A1 | 10/2006 | Li et al. |
| 2006/0239077 A1 | 10/2006 | Park et al. |
| 2006/0239081 A1 | 10/2006 | Roohparvar |
| 2006/0256620 A1 | 11/2006 | Nguyen et al. |
| 2006/0256626 A1 | 11/2006 | Werner et al. |
| 2006/0256891 A1 | 11/2006 | Yuan et al. |
| 2006/0271748 A1 | 11/2006 | Jain et al. |
| 2006/0285392 A1 | 12/2006 | Incarnati et al. |
| 2006/0285396 A1 | 12/2006 | Ha |
| 2007/0006013 A1 | 1/2007 | Moshayedi et al. |
| 2007/0019481 A1 | 1/2007 | Park |
| 2007/0033581 A1 | 2/2007 | Tomlin et al. |
| 2007/0047314 A1 | 3/2007 | Goda et al. |
| 2007/0047326 A1 | 3/2007 | Nguyen et al. |
| 2007/0050536 A1 | 3/2007 | Kolokowsky |
| 2007/0058446 A1 | 3/2007 | Hwang et al. |
| 2007/0061502 A1 | 3/2007 | Lasser et al. |
| 2007/0067667 A1 | 3/2007 | Ikeuchi et al. |
| 2007/0074093 A1 | 3/2007 | Lasser |
| 2007/0086239 A1 | 4/2007 | Litsyn et al. |
| 2007/0086260 A1 | 4/2007 | Sinclair |
| 2007/0089034 A1 | 4/2007 | Litsyn et al. |
| 2007/0091677 A1 | 4/2007 | Lasser et al. |
| 2007/0091694 A1 | 4/2007 | Lee et al. |
| 2007/0103978 A1 | 5/2007 | Conley et al. |
| 2007/0103986 A1 | 5/2007 | Chen |
| 2007/0104211 A1 | 5/2007 | Opsasnick |
| 2007/0109845 A1 | 5/2007 | Chen |
| 2007/0109849 A1 | 5/2007 | Chen |
| 2007/0115726 A1 | 5/2007 | Cohen et al. |
| 2007/0118713 A1 | 5/2007 | Guterman et al. |
| 2007/0143378 A1 | 6/2007 | Gorobetz |
| 2007/0143531 A1 | 6/2007 | Atri |
| 2007/0159889 A1 | 7/2007 | Kang et al. |
| 2007/0159892 A1 | 7/2007 | Kang et al. |
| 2007/0159907 A1 | 7/2007 | Kwak |
| 2007/0168837 A1 | 7/2007 | Murin |
| 2007/0171714 A1 | 7/2007 | Wu et al. |
| 2007/0183210 A1 | 8/2007 | Choi et al. |
| 2007/0189073 A1 | 8/2007 | Aritome |
| 2007/0195602 A1 | 8/2007 | Fong et al. |
| 2007/0206426 A1 | 9/2007 | Mokhlesi |
| 2007/0208904 A1 | 9/2007 | Hsieh et al. |
| 2007/0226599 A1 | 9/2007 | Motwani |
| 2007/0236990 A1 | 10/2007 | Aritome |
| 2007/0253249 A1 | 11/2007 | Kang et al. |
| 2007/0256620 A1 | 11/2007 | Viggiano et al. |
| 2007/0263455 A1 | 11/2007 | Cornwell et al. |
| 2007/0266232 A1 | 11/2007 | Rodgers et al. |
| 2007/0271424 A1 | 11/2007 | Lee et al. |
| 2007/0280000 A1 | 12/2007 | Fujiu et al. |
| 2007/0291571 A1 | 12/2007 | Balasundaram |
| 2007/0297234 A1 | 12/2007 | Cernea et al. |
| 2008/0010395 A1 | 1/2008 | Mylly et al. |
| 2008/0025121 A1 | 1/2008 | Tanzawa |
| 2008/0043535 A1 | 2/2008 | Roohparvar |
| 2008/0049504 A1 | 2/2008 | Kasahara et al. |
| 2008/0049506 A1 | 2/2008 | Guterman |
| 2008/0052446 A1 | 2/2008 | Lasser et al. |
| 2008/0055993 A1 | 3/2008 | Lee |
| 2008/0080243 A1 | 4/2008 | Edahiro et al. |
| 2008/0082730 A1 | 4/2008 | Kim et al. |
| 2008/0089123 A1 | 4/2008 | Chae et al. |
| 2008/0104309 A1 | 5/2008 | Cheon et al. |
| 2008/0104312 A1 | 5/2008 | Lasser |
| 2008/0109590 A1 | 5/2008 | Jung et al. |
| 2008/0115017 A1 | 5/2008 | Jacobson |
| 2008/0123420 A1 | 5/2008 | Brandman et al. |
| 2008/0123426 A1 | 5/2008 | Lutze et al. |
| 2008/0126686 A1 | 5/2008 | Sokolov et al. |
| 2008/0130341 A1 | 6/2008 | Shalvi et al. |

| | | | |
|---|---|---|---|
| 2008/0148115 A1 | 6/2008 | Sokolov et al. |
| 2008/0151618 A1 | 6/2008 | Sharon et al. |
| 2008/0151667 A1 | 6/2008 | Miu et al. |
| 2008/0158958 A1 | 7/2008 | Sokolov et al. |
| 2008/0181001 A1 | 7/2008 | Shalvi |
| 2008/0198650 A1 | 8/2008 | Shalvi et al. |
| 2008/0198654 A1 | 8/2008 | Toda |
| 2008/0209116 A1 | 8/2008 | Caulkins |
| 2008/0209304 A1 | 8/2008 | Winarski et al. |
| 2008/0215798 A1 | 9/2008 | Sharon et al. |
| 2008/0219050 A1 | 9/2008 | Shalvi et al. |
| 2008/0239093 A1 | 10/2008 | Easwar et al. |
| 2008/0239812 A1 | 10/2008 | Abiko et al. |
| 2008/0253188 A1 | 10/2008 | Aritome |
| 2008/0263262 A1 | 10/2008 | Sokolov et al. |
| 2008/0263676 A1 | 10/2008 | Mo et al. |
| 2008/0270730 A1 | 10/2008 | Lasser et al. |
| 2008/0282106 A1 | 11/2008 | Shalvi et al. |
| 2008/0288714 A1 | 11/2008 | Salomon et al. |
| 2009/0013233 A1 | 1/2009 | Radke |
| 2009/0024905 A1 | 1/2009 | Shalvi et al. |
| 2009/0034337 A1 | 2/2009 | Aritome |
| 2009/0043831 A1 | 2/2009 | Antonopoulos et al. |
| 2009/0043951 A1 | 2/2009 | Shalvi et al. |
| 2009/0049234 A1 | 2/2009 | Oh et al. |
| 2009/0073762 A1 | 3/2009 | Lee et al. |
| 2009/0086542 A1 | 4/2009 | Lee et al. |
| 2009/0089484 A1 | 4/2009 | Chu |
| 2009/0091979 A1 | 4/2009 | Shalvi |
| 2009/0094930 A1 | 4/2009 | Schwoerer |
| 2009/0106485 A1 | 4/2009 | Anholt |
| 2009/0112949 A1 | 4/2009 | Ergan et al. |
| 2009/0132755 A1 | 5/2009 | Radke |
| 2009/0144600 A1 | 6/2009 | Perlmutter et al. |
| 2009/0150894 A1 | 6/2009 | Huang et al. |
| 2009/0157950 A1 | 6/2009 | Selinger |
| 2009/0157964 A1 | 6/2009 | Kasorla et al. |
| 2009/0158126 A1 | 6/2009 | Perlmutter et al. |
| 2009/0168524 A1 | 7/2009 | Golov et al. |
| 2009/0172257 A1 | 7/2009 | Prins et al. |
| 2009/0172261 A1 | 7/2009 | Prins et al. |
| 2009/0193184 A1 | 7/2009 | Yu et al. |
| 2009/0199074 A1 | 8/2009 | Sommer et al. |
| 2009/0204824 A1 | 8/2009 | Lin et al. |
| 2009/0204872 A1 | 8/2009 | Yu et al. |
| 2009/0213653 A1 | 8/2009 | Perlmutter et al. |
| 2009/0213654 A1 | 8/2009 | Perlmutter et al. |
| 2009/0225595 A1 | 9/2009 | Kim |
| 2009/0265509 A1 | 10/2009 | Klein |
| 2009/0300227 A1 | 12/2009 | Nochimowski et al. |
| 2009/0323412 A1 | 12/2009 | Mokhlesi et al. |
| 2009/0327608 A1 | 12/2009 | Eschmann |
| 2010/0017650 A1 | 1/2010 | Chin et al. |
| 2010/0034022 A1 | 2/2010 | Dutta et al. |
| 2010/0057976 A1 | 3/2010 | Lasser |
| 2010/0061151 A1 | 3/2010 | Miwa et al. |
| 2010/0082883 A1 | 4/2010 | Chen et al. |
| 2010/0083247 A1 | 4/2010 | Kanevsky et al. |
| 2010/0110580 A1 | 5/2010 | Takashima |
| 2010/0131697 A1 | 5/2010 | Alrod et al. |
| 2010/0142268 A1 | 6/2010 | Aritome |
| 2010/0142277 A1 | 6/2010 | Yang et al. |
| 2010/0169547 A1 | 7/2010 | Ou |
| 2010/0169743 A1 | 7/2010 | Vogan et al. |
| 2010/0174847 A1 | 7/2010 | Paley et al. |
| 2010/0211803 A1 | 8/2010 | Lablans |
| 2010/0287217 A1 | 11/2010 | Borchers et al. |
| 2011/0010489 A1 | 1/2011 | Yeh |
| 2011/0060969 A1 | 3/2011 | Ramamoorthy et al. |
| 2011/0066793 A1 | 3/2011 | Burd |
| 2011/0075482 A1 | 3/2011 | Shepard et al. |
| 2011/0107049 A1 | 5/2011 | Kwon et al. |
| 2011/0149657 A1 | 6/2011 | Haratsch et al. |
| 2011/0199823 A1 | 8/2011 | Bar-Or et al. |
| 2011/0302354 A1 | 12/2011 | Miller |

FOREIGN PATENT DOCUMENTS

| | | |
|---|---|---|
| EP | 1434236 B1 | 6/2004 |
| EP | 1605509 A1 | 12/2005 |
| WO | 9610256 A1 | 4/1996 |
| WO | 9828745 A1 | 7/1998 |
| WO | 02100112 A1 | 12/2002 |
| WO | 2003100791 A1 | 12/2003 |
| WO | 2007046084 A2 | 4/2007 |
| WO | 2007132452 A2 | 11/2007 |
| WO | 2007132456 A2 | 11/2007 |
| WO | 2007132458 A2 | 11/2007 |
| WO | WO-2007132453 | 11/2007 |
| WO | WO-2007132457 | 11/2007 |
| WO | 2007146010 A2 | 12/2007 |
| WO | 2008026203 A2 | 3/2008 |
| WO | WO-2008026203 | 3/2008 |
| WO | 2008053473 A2 | 5/2008 |
| WO | 2008068747 A2 | 6/2008 |
| WO | 2008067284 A1 | 7/2008 |
| WO | 2008083131 A2 | 7/2008 |
| WO | 2008099958 A1 | 8/2008 |
| WO | 2008111058 A2 | 9/2008 |
| WO | 2008124760 A2 | 10/2008 |
| WO | 2008139441 A2 | 11/2008 |
| WO | 2009037691 A2 | 3/2009 |
| WO | 2009037697 A2 | 3/2009 |
| WO | 2009038961 A2 | 3/2009 |
| WO | 2009050703 A2 | 4/2009 |
| WO | 2009053961 A2 | 4/2009 |
| WO | 2009053962 A2 | 4/2009 |
| WO | 2009053963 A2 | 4/2009 |
| WO | 2009063450 A2 | 5/2009 |
| WO | 2009072100 A2 | 6/2009 |
| WO | 2009072101 A2 | 6/2009 |
| WO | 2009072102 A2 | 6/2009 |
| WO | 2009072103 A2 | 6/2009 |
| WO | 2009072104 A2 | 6/2009 |
| WO | 2009072105 A2 | 6/2009 |
| WO | 2009074978 A2 | 6/2009 |
| WO | 2009074979 A2 | 6/2009 |
| WO | 2009078006 A2 | 6/2009 |
| WO | 2009095902 A2 | 8/2009 |
| WO | 2011024015 A1 | 3/2011 |

OTHER PUBLICATIONS

Blahut, R.E., "Theory and Practice of Error Control Codes," Addison-Wesley, May 1984, section 3.2, pp. 47-48.

Chang, L., "Hybrid Solid State Disks: Combining Heterogeneous NAND Flash in Large SSDs", ASPDAC, Jan. 2008.

Cho et al., "Multi-Level NAND Flash Memory with Non-Uniform Threshold Voltage Distribution," IEEE International Solid-State Circuits Conference (ISSCC), San Francisco, CA, Feb. 5-7, 2001, pp. 28-29 and 424.

Databahn™, "Flash memory controller IP", Denali Software, Inc., 1994 https://www.denali.com/en/products/databahn_flash.jsp.

Datalight, Inc., "FlashFX Pro 3.1 High Performance Flash Manager for Rapid Development of Reliable Products", Nov. 16, 2006.

Duann, N., Silicon Motion Presentation "SLC & MLC Hybrid", Flash Memory Summit, Santa Clara, USA, Aug. 2008.

Engh et al., "A self adaptive programming method with 5 mV accuracy for multi-level storage in FLASH", pp. 115-118, Proceedings of the IEEE 2002 Custom Integrated Circuits Conference, May 12-15, 2002.

Goodman et al., "On-Chip ECC for Multi-Level Random Access Memories," Proceedings of the IEEE/CAM Information Theory Workshop, Ithaca, USA, Jun. 25-29, 1989.

Han et al., "An Intelligent Garbage Collection Algorithm for Flash Memory Storages", Computational Science and Its Applications—ICCSA 2006, vol. 3980/2006, pp. 1019-1027, Springer Berlin / Heidelberg, Germany, May 11, 2006.

Han et al., "CATA: A Garbage Collection Scheme for Flash Memory Fi e Systems", Ubiquitous Intelligence and Computing, vol. 4159/2006, pp. 103-112, Springer Berlin / Heidelberg, Aug. 25, 2006.

Horstein, "On the Design of Signals for Sequential and Nonsequential Detection Systems with Feedback," IEEE Transactions on Information Theory IT-12:4 (Oct. 1966), pp. 448-455.

Jung et al., in "A 117 mm.sup.2 3.3V Only 128 Mb Multilevel NAND Flash Memory for Mass Storage Applications," IEEE Journal of Solid State Circuits, (11:31), Nov. 1996, pp. 1575-1583.

Kawaguchi et al. 1995. A flash-memory based file system. In Proceedings of the USENIX 1995 Technical Conference, New Orleans, Louisiana. 155-164.
Lee et al., "Effects of Floating Gate Interference on NAND Flash Memory Cell Operation", IEEE Electron Device Letters, vol. 23, No. 5, pp. 264-266, May 2002.
Mielke et al., "Recovery Effects in the Distributed Cycling of Flash Memories", IEEE 44th Annual International Reliability Physics Symposium, pp. 29-35, San Jose, USA, Mar. 2006.
ONFI, "Open NAND Flash Interface Specification," revision 1.0, Dec. 28, 2006.
Phison Electronics Corporation, "PS8000 Controller Specification (for SD Card)", revision 1.2, Document No. S-07018, Mar. 28, 2007.
Shalvi, et al., "Signal Codes," Proceedings of the 2003 IEEE Information Theory Workshop (ITW'2003), Paris, France, Mar. 31-Apr. 4, 2003.
Suh et al., "A 3.3V 32Mb NAND Flash Memory with Incremental Step Pulse Programming Scheme", IEEE Journal of Solid-State Circuits, vol. 30, No. 11, pp. 1149-1156, Nov. 1995.
ST Microelectronics, "Bad Block Management in NAND Flash Memories", Application note AN-1819, Geneva, Switzerland, May 2004.
ST Microelectronics, "Wear Leveling in Single Level Cell NAND Flash Memories," Application note AN-1822 Geneva, Switzerland, Feb. 2007.
Takeuchi et al., "A Double Level $V_{TH}$ Select Gate Array Architecture for Multi-Level NAND Flash Memories", Digest of Technical Papers, 1995 Symposium on VLSI Circuits, pp. 59-70, Jun. 8-10, 1995.
Wu et al., "eNVy: A non-Volatile, Main Memory Storage System", Proceedings of the 6th International Conference on Architectural support for programming languages and operating systems, pp. 86-87, San Jose, USA, 1994.
International Application PCT/IL2007/000575 Patentability report dated Mar. 26, 2009.
International Application PCT/IL2007/000575 Search Report dated May 30, 2008.
International Application PCT/IL2007/000576 Patentability Report dated Mar. 19, 2009.
International Application PCT/IL2007/000576 Search Report dated Jul. 7, 2008.
International Application PCT/IL2007/000579 Patentability report dated Mar. 10, 2009.
International Application PCT/IL2007/000579 Search report dated Jul. 3, 2008.
International Application PCT/IL2007/000580 Patentability Report dated Mar. 10, 2009.
International Application PCT/IL2007/000580 Search Report dated Sep. 11, 2008.
International Application PCT/IL2007/000581 Patentability Report dated Mar. 26, 2009.
International Application PCT/IL2007/000581 Search Report dated Aug. 25, 2008.
International Application PCT/IL2007/001059 Patentability report dated Apr. 19, 2009.
International Application PCT/IL2007/001059 Search report dated Aug. 7, 2008.
International Application PCT/IL2007/001315 search report dated Aug. 7, 2008.
International Application PCT/IL2007/001315 Patentability Report dated May 5, 2009.
International Application PCT/IL2007/001316 Search report dated Jul. 22, 2008.
International Application PCT/IL2007/001316 Patentability Report dated May 5, 2009.
International Application PCT/IL2007/001488 Search report dated Jun. 20, 2008.
International Application PCT/IL2008/000329 Search report dated Nov. 25, 2008.
International Application PCT/IL2008/000519 Search report dated Nov. 20, 2008.
International Application PCT/IL2008/001188 Search Report dated Jan. 28, 2009.
International Application PCT/IL2008/001356 Search Report dated Feb. 3, 2009.
International Application PCT/IL2008/001446 Search report dated Feb. 20, 2009.
U.S. Appl. No. 11/949,135 Official Action dated Oct. 2, 2009.
U.S. Appl. No. 12/019,011 Official Action dated Nov. 20, 2009.
Takeuchi et al., "A Multipage Cell Architecture for High-Speed Programming Multilevel NAND Flash Memories", IEEE Journal of Solid State Circuits, vol. 33, No. 8, Aug. 1998.
JEDEC Standard JESD84-C44, "Embedded MultiMediaCard (e•MMC) Mechanical Standard, with Optional Reset Signal", Jedec Solid State Technology Association, USA, Jul. 2009.
Jedec, "UFS Specification", version 0.1, Nov. 11, 2009.
SD Group and SD Card Association, "SD Specifications Part 1 Physical Layer Specification", version 3.01, draft 1.00, Nov. 9, 2009.
Compaq et al., "Universal Serial Bus Specification", revision 2.0, Apr. 27, 2000.
Serial ATA International Organization, "Serial ATA Revision 3.0 Specification", Jun. 2, 2009.
Gotou, H., "An Experimental Confirmation of Automatic Threshold Voltage Convergence in a Flash Memory Using Alternating Word-Line Voltage Pulses", IEEE Electron Device Letters, vol. 18, No. 10, pp. 503-505, Oct. 1997.
Huffman, A., "Non-Volatile Memory Host Controller Interface (NVMHCI)", Specification 1.0, Apr. 14, 2008.
Panchbhai et al., "Improving Reliability of NAND Based Flash Memory Using Hybrid SLC/MLC Device", Project Proposal for CSci 8980—Advanced Storage Systems, University of Minnesota, USA, Spring 2009.
U.S. Appl. No. 11/957,970 Official Action dated May 20, 2010.
Shalvi et al., U.S. Appl. No. 12/822,207 "Adaptive Over-Provisioning in Memory Systems" filed Jun. 24, 2010.
U.S. Appl. No. 12/880,101 "Reuse of Host Hibernation Storage Space by Memory Controller", filed Sep. 12, 2010.
U.S. Appl. No. 12/890,724 "Error Correction Coding Over Multiple Memory Pages", filed Sep. 27, 2010.
U.S. Appl. No. 12/171,797 Official Action dated Aug. 25, 2010.
U.S. Appl. No. 12/497,707 Official Action dated Sep. 15, 2010.
U.S. Appl. No. 11/995,801 Official Action dated Oct. 15, 2010.
Numonyx, "M25PE16: 16-Mbit, page-erasable serial flash memory with byte-alterability, 75 MHz SPI bus, standard pinout", Apr. 2008.
Hong et al., "NAND Flash-based Disk Cache Using SLC/MLC Combined Flash Memory", 2010 International Workshop on Storage Network Architecture and Parallel I/Os, pp. 21-30, USA, May 3, 2010.
U.S. Appl. No. 11/945,575 Official Action dated Aug. 24, 2010.
U.S. Appl. No. 12/045,520 Official Action dated Nov. 16, 2010.
U.S. Appl. No. 11/995,814 Official Action dated Dec. 17, 2010.
U.S. Appl. No. 12/388,528 Official Action dated Nov. 29, 2010.
U.S. Appl. No. 12/251,471 Official Action dated Jan. 3, 2011.
Engineering Windows 7, "Support and Q&A for Solid-State Drives", e7blog, May 5, 2009.
Micron Technology Inc., "Memory Management in NAND Flash Arrays", Technical Note, year 2005.
Kang et al., "A Superblock-based Flash Translation Layer for NAND Flash Memory", Proceedings of the 6th ACM & IEEE International Conference on Embedded Software, pp. 161-170, Seoul, Korea, Oct. 22-26, 2006.
Park et al., "Sub-Grouped Superblock Management for High-Performance Flash Storages", IEICE Electronics Express, vol. 6, No. 6, pp. 297-303, Mar. 25, 2009.
"How to Resolve "Bad Super Block: Magic Number Wrong" in BSD", Free Online Articles Director Article Base, posted Sep. 5, 2009.
UBUNTU Forums, "Memory Stick Failed IO Superblock", posted Nov. 11, 2009.
Super User Forums, "SD Card Failure, can't read superblock", posted Aug. 8, 2010.
U.S. Appl. No. 12/987,174 "Redundant Data Storage in Multi-Die Memory Systems", filed Jan. 10, 2011.
U.S. Appl. No. 12/987,175 "Redundant Data Storage Schemes for Multi-Die Memory Systems" filed Jan. 10, 2011.
U.S. Appl. No. 12/963,649 "Memory Management Schemes for Non-Volatile Memory Devices" filed Dec. 9, 2010.

U.S. Appl. No. 13/021,754 "Reducing Peak Current in Memory Systems" filed Feb. 6, 2011.
U.S. Appl. No. 12/534,898 Official Action dated Mar. 23, 2011.
U.S. Appl. No. 13/047,822, filed Mar. 15, 2011.
U.S. Appl. No. 13/069,406, filed Mar. 23, 2011.
U.S. Appl. No. 13/088,361, filed Apr. 17, 2011.
Ankolekar et al., "Multibit Error-Correction Methods for Latency-Constrained Flash Memory Systems", IEEE Transactions on Device and Materials Reliability, vol. 10, No. 1, pp. 33-39, Mar. 2010.
U.S. Appl. No. 12/344,233 Official Action dated Jun. 24, 2011.
U.S. Appl. No. 11/995,813 Official Action dated Jun. 16, 2011.
Berman et al., "Mitigating Inter-Cell Coupling Effects in MLC NAND Flash via Constrained Coding", Flash Memory Summit, Santa Clara, USA, Aug. 19, 2010.
U.S. Appl. No. 12/178,318 Official Action dated May 31, 2011.
CN Patent Application # 200780026181.3 Official Action dated Apr. 8, 2011.
Wei, L., "Trellis-Coded Modulation With Multidimensional Constellations", IEEE Transactions on Information Theory, vol. IT-33, No. 4, pp. 483-501, Jul. 1987.
U.S. Appl. No. 13/114,049 Official Action dated Sep. 12, 2011.
U.S. Appl. No. 12/405,275 Official Action dated Jul. 29, 2011.
Conway et al., "Sphere Packings, Lattices and Groups", 3rd edition, chapter 4, pp. 94-135, Springer, New York, USA 1998.
Chinese Patent Application # 200780040493.X Official Action dated Jun. 15, 2011.
U.S. Appl. No. 12/037,487 Official Action dated Oct. 3, 2011.
U.S. Appl. No. 12/649,360 Official Action dated Aug. 9, 2011.
U.S. Appl. No. 13/192,504, filed Jul. 28, 2011.
U.S. Appl. No. 13/192,852, filed Aug. 2, 2011.
U.S. Appl. No. 13/231,963, filed Sep. 14, 2011.
U.S. Appl. No. 13/239,408, filed Sep. 22, 2011.
U.S. Appl. No. 13/239,411, filed Sep. 22, 2011.
U.S. Appl. No. 13/214,257, filed Aug. 22, 2011.
U.S. Appl. No. 13/192,501, filed Jul. 28, 2011.
U.S. Appl. No. 13/192,495, filed Jul. 28, 2011.
U.S. Appl. No. 12/323,544 Official Action dated Mar. 9, 2012.
Chinese Patent Application # 200780026181.3 Official Action dated Mar. 7, 2012.
Chinese Patent Application # 200780026094.8 Official Action dated Feb. 2, 2012.
U.S. Appl. No. 12/332,370 Official Action dated Mar. 8, 2012.
U.S. Appl. No. 12/579,432 Official Action dated Feb. 29, 2012.
U.S. Appl. No. 12/522,175 Official Action dated Mar. 27, 2012.
U.S. Appl. No. 12/607,085 Official Action dated Mar. 28, 2012.
Budilovsky et al., "Prototyping a High-Performance Low-Cost Solid-State Disk", SYSTOR—The 4th Annual International Systems and Storage Conference, Haifa, Israel, May 30-Jun. 1, 2011.
NVM Express Protocol, "NVM Express", Revision 1.0b, Jul. 12, 2011.
SCSI Protocol, "Information Technology—SCSI Architecture Model—5 (SAM-5)", INCITS document T10/2104-D, revision 01, Jan. 28, 2009.
SAS Protocol, "Information Technology—Serial Attached SCSI—2 (SAS-2)", INCITS document T10/1760-D, revision 15a, Feb. 22, 2009.
U.S. Appl. No. 12/323,544 Office Action dated Dec. 13, 2011.
U.S. Appl. No. 12/332,368 Office Action dated Nov. 10, 2011.
U.S. Appl. No. 12/063,544 Office Action dated Dec. 14, 2011.
U.S. Appl. No. 12/186,867 Office Action dated Jan. 17, 2012.
Kim et al., "Multi-bit Error Tolerant Caches Using Two-Dimensional Error Coding", Proceedings of the 40th Annual ACM/IEEE International Symposium on Microarchitecture (MICRO-40), Chicago, USA, Dec. 1-5, 2007.
U.S. Appl. No. 12/037,487 Office Action dated Jan. 3, 2012.
U.S. Appl. No. 11/995,812 Office Action dated Oct. 28, 2011.
U.S. Appl. No. 12/551,567 Office Action dated Oct. 27, 2011.
U.S. Appl. No. 12/618,732 Office Action dated Nov. 4, 2011.
U.S. Appl. No. 12/649,382 Office Action dated Jan. 6, 2012.
U.S. Appl. No. 13/284,909, filed Oct. 30, 2011.
U.S. Appl. No. 13/284,913, filed Oct. 30, 2011.
U.S. Appl. No. 13/338,335, filed Dec. 28, 2011.
U.S. Appl. No. 13/355,536, filed Jan. 22, 2012.
Patent Application U.S. Appl. No. 11/995,814, filed Jan. 15, 2008, entitled "Reading Memory Cells using Multiple Thresholds".
Bez et al., "Introduction to Flash Memory," Proceedings of the IEEE, vol. 91, No. 4, Apr. 2003, pp. 489-502.
Eitan et al., "Multilevel Flash Cells and their Trade-Offs," Proceedings of the 1996 IEEE International Electron Devices Meeting (IEDM), New York, NY, pp. 169-172.
Eitan et al., "Can NROM, a 2-bit, Trapping Storage NVM Cell, Give a Real Challenge to Floating Gate Cells?" Proceedings of the 1999 International Conference on Solid State Devices and Materials (SSDM), Tokyo, Japan, Sep. 21-24, 1999, pp. 522-524.
Maayan et al., "A 512 Mb NROM Flash Data Storage Memory with 8 MB/s Data Rate," Proceedings of the 2002 IEEE International Solid State Circuits Conference (ISSCC 2002), San Francisco, California, Feb. 3-7, 2002, pp. 100-101.
Kim et al., "Future Memory Technology including Emerging New Memories," Proceedings of the 24th International Conference on Microelectronic (MIEL), Nis, Serbia and Montenegro, May 16-19, 2004, vol. 1, pp. 377-384.
Shiozaki "Adaptive Type-II Hybrid Broadcast ARQ System," IEEE Transactions on Communications, vol. 44, issue 4, Apr. 1996, pp. 420-422.
US 7,161,836, 01/2007, Wan et al. (withdrawn)

* cited by examiner

DATA STORAGE WITH INCREMENTAL REDUNDANCY

CROSS-REFERENCE TO RELATED APPLICATIONS

This application claims the benefit of U.S. Provisional Patent Application 60/917,649, filed May 12, 2007, U.S. Provisional Patent Application 60/983,950, filed Oct. 31, 2007, and U.S. Provisional Patent Application 60/989,812, filed Nov. 22, 2007, whose disclosures are incorporated herein by reference.

FIELD OF THE INVENTION

The present invention relates generally to memory devices, and particularly to error correction schemes used for data storage in memory devices.

BACKGROUND OF THE INVENTION

Several types of memory devices, such as Flash memories, use arrays of analog memory cells for storing data. Each analog memory cell stores a quantity of an analog value, also referred to as a storage value, such as an electrical charge or voltage. The storage value represents the information stored in the cell. In Flash memories, for example, each analog memory cell holds a certain amount of electrical charge. The range of possible analog values is typically divided into regions, each region corresponding to one or more data bit values. Data is written to an analog memory cell by writing a nominal analog value that corresponds to the desired bit or bits.

Some memory devices, which are commonly referred to as Single-Level Cell (SLC) devices, store a single bit of information in each memory cell, i.e., each memory cell can be programmed to assume two possible memory states. Higher-density devices, often referred to as Multi-Level Cell (MLC) devices, store two or more bits per memory cell, i.e., can be programmed to assume more than two possible memory states.

Flash memory devices are described, for example, by Bez et al., in "Introduction to Flash Memory," Proceedings of the IEEE, volume 91, number 4, April, 2003, pages 489-502, which is incorporated herein by reference. Multi-level Flash cells and devices are described, for example, by Eitan et al., in "Multilevel Flash Cells and their Trade-Offs," Proceedings of the 1996 IEEE International Electron Devices Meeting (IEDM), New York, N.Y., pages 169-172, which is incorporated herein by reference. The paper compares several kinds of multilevel Flash cells, such as common ground, DINOR, AND, NOR and NAND cells.

Eitan et al., describe another type of analog memory cell called Nitride Read Only Memory (NROM) in "Can NROM, a 2-bit, Trapping Storage NVM Cell, Give a Real Challenge to Floating Gate Cells?" Proceedings of the 1999 International Conference on Solid State Devices and Materials (SSDM), Tokyo, Japan, Sep. 21-24, 1999, pages 522-524, which is incorporated herein by reference. NROM cells are also described by Maayan et al., in "A 512 Mb NROM Flash Data Storage Memory with 8 MB/s Data Rate", Proceedings of the 2002 IEEE International Solid-State Circuits Conference (ISSCC 2002), San Francisco, Calif., Feb. 3-7, 2002, pages 100-101, which is incorporated herein by reference. Other exemplary types of analog memory cells are Floating Gate (FG) cells, Ferroelectric RAM (FRAM) cells, magnetic RAM (MRAM) cells, Charge Trap Flash (CTF) and phase change RAM (PRAM, also referred to as Phase Change Memory—PCM) cells. FRAM, MRAM and PRAM cells are described, for example, by Kim and Koh in "Future Memory Technology including Emerging New Memories," Proceedings of the 24$^{th}$ International Conference on Microelectronics (MIEL), Nis, Serbia and Montenegro, May 16-19, 2004, volume 1, pages 377-384, which is incorporated herein by reference.

Incremental redundancy schemes are error correction schemes in which the amount of redundancy used in the decoding process is increased incrementally, depending on the decoding performance. In a typical incremental redundancy scheme, error correction is initially attempted using a certain amount of redundancy. If the initial decoding attempt fails, decoding is attempted again using additional redundancy. Incremental redundancy schemes are described, for example, by Shiozaki in "Adaptive Type-II Hybrid Broadcast ARQ System," IEEE Transactions on Communications, volume 44, issue 4, April, 1996, pages 420-422, which is incorporated herein by reference. The paper describes a type-II hybrid broadcast Automatic-Repeat-reQuest (ARQ) scheme with Adaptive Forward Error Correction (AFEC) using Bose-Chaudhuri-Hocquenghem (BCH) codes. The proposed scheme increases the error correcting capability of BCH codes according to each channel state using incremental redundancy.

SUMMARY OF THE INVENTION

Embodiments of the present invention provide a method for operating a memory that includes a plurality of memory cells, including:

encoding input data with an Error Correction Code (ECC) so as to produce input encoded data including first and second sections, such that the ECC is decodable based on the first section at a first redundancy, and based on both the first and the second sections at a second redundancy that is higher than the first redundancy;

storing the input encoded data in the memory cells;

after storing at least part of the input encoded data, reading from the memory cells output encoded data; and evaluating a condition related to the output encoded data and reconstructing the input data using a decoding level selected, responsively to the evaluated condition, from a group of decoding levels consisting of:

a first decoding level, at which a first part of the output encoded data corresponding to the first section of the input encoded data is processed so as to decode the ECC at the first redundancy; and a second decoding level, at which the first part and a second part of the output encoded data corresponding to the second section of the input encoded data are processed jointly so as to decode the ECC at the second redundancy.

In some embodiments, the condition includes a failure to reconstruct the input data at the first redundancy. In an embodiment, evaluating the condition includes estimating a distortion level in the memory cells in which the first part is stored, and the condition is defined with respect to the estimated distortion level. In another embodiment, the ECC is decodable based on the first section at a first error correction capability, and based on both the first and the second sections at a second error correction capability that is higher than the first error correction capability.

In yet another embodiment, storing the input encoded data includes partitioning the plurality of the memory cells into a data storage area and a redundancy storage area different from the data storage area, storing the first section in the data storage area and storing the second section in the redundancy storage area. Reading the output encoded data may include reading the first part from the memory cells in a single read operation, and reading the second part in another read operation.

In a disclosed embodiment, storing the input encoded data includes storing the first and second sections in the memory cells before reading the output encoded data. In an alternative embodiment, encoding the input data includes producing the second section responsively to processing the first part of the output encoded data.

In some embodiments, the first section includes uncoded data bits, encoding the data includes selecting a subset of the uncoded data bits from the first section and encoding the selected subset to produce redundancy bits, and the second section includes the redundancy bits. In an embodiment, reconstructing the input data using the second decoding level includes decoding the redundancy bits in the second part so as to reconstruct the subset of the uncoded data bits, replacing the subset of the uncoded data bits in the first part with the reconstructed subset of the uncoded data bits, and decoding the first part, including the replaced subset, so as to reconstruct the input data.

In another embodiment, reconstructing the input data using the first decoding level includes determining a number of errors that were corrected by the ECC at the first redundancy and comparing the number to a threshold, and encoding the input data includes producing and storing the second section responsively to the number exceeding the threshold. Producing and storing the second section may include storing in the second section locations in the memory of bits in which the errors that were corrected by the ECC are located. In a disclosed embodiment, encoding the input data includes encoding redundancy bits produced by the ECC in the first and second sections with an additional ECC.

In some embodiments, the memory cells include analog memory cells. In an embodiment, storing the input encoded data includes writing storage values that represent the data in the first section to a group of the analog memory cells and verifying the written storage values, and encoding the data includes estimating a storage reliability of the group and producing the second section responsively to the estimated storage reliability. Writing and verifying the storage values may include applying a sequence of programming iterations to the analog memory cells in the group, and determining a number of the programming iterations in the sequence based on the estimated storage reliability. In an embodiment, encoding the input data includes measuring a distortion in the memory cells, and producing the second section only responsively to determining that the first redundancy is insufficient for decoding the ECC in the presence of the distortion.

In another embodiment, the condition is defined with respect to a location in the memory of the memory cells in which the first part is stored. In yet another embodiment, the method includes accepting a reliability indication regarding the memory cells in which the first part is stored, and the condition is defined with respect to the reliability indication.

There is additionally provided, in accordance with an embodiment of the present invention, a data storage apparatus, including:

an interface, which is operative to communicate with a memory that includes a plurality of memory cells; and a processor, which is connected to the interface and is coupled to encode input data with an Error Correction Code (ECC) so as to produce input encoded data including first and second sections, such that the ECC is decodable based on the first section at a first redundancy and based on both the first and the second sections at a second redundancy that is higher than the first redundancy, to store the input encoded data in the memory cells, to read from the memory cells output encoded data after storing at least part of the input encoded data, to evaluate a condition related to the output encoded data and to reconstruct the input data using a decoding level selected, responsively to the evaluated condition, from a group of decoding levels consisting of:

a first decoding level, at which a first part of the output encoded data corresponding to the first section of the input encoded data is processed so as to decode the ECC at the first redundancy; and a second decoding level, at which the first part and a second part of the output encoded data corresponding to the second section of the input encoded data are processed jointly so as to decode the ECC at the second redundancy.

There is also provided, in accordance with an embodiment of the present invention, a data storage apparatus, including:

a memory, which includes a plurality of memory cells; and a processor, which is coupled to encode input data with an Error Correction Code (ECC) so as to produce input encoded data including first and second sections, such that the ECC is decodable based on the first section at a first redundancy and based on both the first and the second sections at a second redundancy that is higher than the first redundancy, to store the input encoded data in the memory cells, to read from the memory cells output encoded data after storing at least part of the input encoded data, to evaluate a condition related to the output encoded data and to reconstruct the input data using a decoding level selected, responsively to the evaluated condition, from a group of decoding levels consisting of:

a first decoding level, at which a first part of the output encoded data corresponding to the first section of the input encoded data is processed so as to decode the ECC at the first redundancy; and a second decoding level, at which the first part and a second part of the output encoded data corresponding to the second section of the input encoded data are processed jointly so as to decode the ECC at the second redundancy.

The present invention will be more fully understood from the following detailed description of the embodiments thereof, taken together with the drawings in which:

DETAILED DESCRIPTION OF EMBODIMENTS

Overview

Data that is stored in analog memory cells is often encoded with an Error Correction Code (ECC) prior to storage, and the ECC is decoded when retrieving the data. The desired error correction capability of the ECC decoding process often varies from one group of cells to another, as well as over time. The desired ECC decoding performance may change, for example, because of variations in distortion characteristics of the cells. In order for the ECC decoding process to reconstruct the data properly, the actual error correction capability of the ECC should at least match the desired level. An excessively low error correction capability will result in decoding failure. An excessively high error correction capability may waste memory space and other system resources, and may cause unnecessarily high latency and/or power consumption.

In view of the highly-variable nature of the desired error correction capability of the ECC, embodiments of the present invention provide improved error correction schemes for memory devices. The methods and systems described herein match the actual error correction capability of the ECC decoding process to the desired error correction capability, so as to optimize the use of system resources and minimize performance degradation.

The methods and systems described herein apply error correction in an incremental manner. In some embodiments, a Memory Signal Processor (MSP) stores data in a memory device that includes an array of analog memory cells. The MSP encodes the data for storage in the memory cells with an ECC that lends itself to incremental decoding, i.e., an ECC that is decodable using varying amounts of redundancy. When retrieving data from the memory cells, the MSP initially attempts to decode the ECC using a certain amount of redundancy, and increases the amount of redundancy if the initial decoding attempt fails.

In some embodiments, the MSP produces and stores multiple sets of redundancy bits (referred to as "redundancy sets") a-priori, and decodes the ECC using an incrementally-increasing number of redundancy sets, until decoding is successful. Alternatively, the MSP assesses the current ECC decoding performance during the life cycle of the memory device. When the decoding performance degrades to reach a certain tolerable level, the MSP produces and stores additional redundancy information for future use. The use of additional redundancy may alternatively be triggered by other kinds of conditions that are described hereinbelow.

When using the methods described herein, ECC decoding resources such as encoding/decoding time, computational complexity and storage capacity are used only to the extent necessary. Adverse effects of high-performance ECC decoding, such as increased latency and power consumption, are minimized. Therefore, memory devices and memory controllers that use these methods can provide high-reliability, high-density and low-latency data storage at low cost.

System Description

Figure 1:
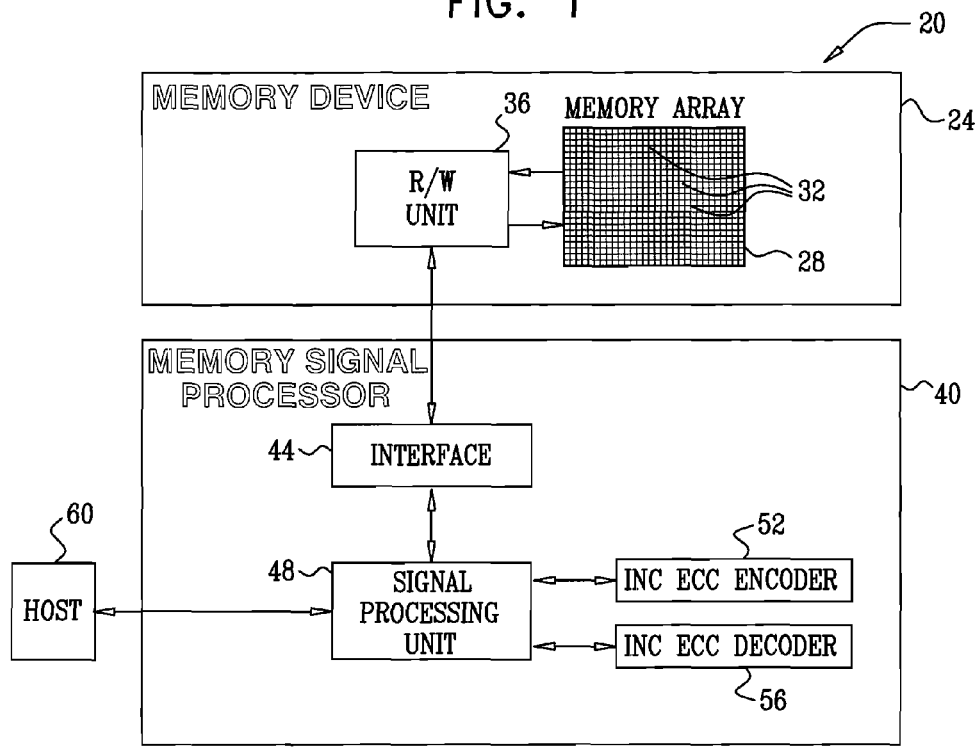
FIG. 1 is a block diagram that schematically illustrates a memory system, in accordance with an embodiment of the present invention.

FIG. 1 is a block diagram that schematically illustrates a memory system 20, in accordance with an embodiment of the present invention. System 20 can be used in various host systems and devices, such as in computing devices, cellular phones or other communication terminals, removable memory modules ("disk-on-key" devices), digital cameras, music and other media players and/or any other system or device in which data is stored and retrieved.

System 20 comprises a memory device 24, which stores data in a memory cell array 28. The memory cell array comprises multiple analog memory cells 32. In the context of the present patent application and in the claims, the term "analog memory cell" is used to describe any memory cell that holds a continuous, analog value of a physical parameter, such as an electrical voltage or charge. Array 32 may comprise analog memory cells of any kind, such as, for example, NAND, NOR and CTF Flash cells, PCM, NROM, FRAM, MRAM and DRAM cells.

The charge levels stored in the cells and/or the analog voltages or currents written into and read out of the cells are referred to herein collectively as analog values or storage values. Although the embodiments described herein mainly address threshold voltages, the methods and systems described herein may be used with any other suitable kind of storage values.

System 20 stores data in the analog memory cells by programming the cells to assume respective memory states, which are also referred to as programming levels. The programming levels are selected from a finite set of possible levels, and each level corresponds to a certain nominal storage value. For example, a 2 bit/cell MLC can be programmed to assume one of four possible programming levels by writing one of four possible nominal storage values into the cell.

Memory device 24 comprises a reading/writing (R/W) unit 36, which converts data for storage in the memory device to analog storage values and writes them into memory cells 32. In alternative embodiments, the R/W unit does not perform the conversion, but is provided with voltage samples, i.e., with the storage values for storage in the cells. The R/W unit typically programs the cells using an iterative Program and Verify (P&V) process, as is known in the art. When reading data out of array 28, R/W unit 36 converts the storage values of memory cells 32 into digital samples having a resolution of one or more bits.

The storage and retrieval of data in and out of memory device 24 is performed by a Memory Signal Processor (MSP) 40. MSP 40 comprises an interface 44 for communicating with memory device 24, and a signal processing unit 48, which processes the data that is written into and read from device 24. In some embodiments, unit 48 produces the storage values for storing in the memory cells and provides these values to R/W unit 36. Alternatively, unit 48 provides the data for storage, and the conversion to storage values is carried out by the R/W unit internally to the memory device.

The data that is stored in device 24 is encoded with an Error Correction Code (ECC). For this purpose, MSP 40 comprises an ECC encoder 52 that encodes the data prior to its storage in the memory cells. The MSP further comprises an ECC decoder 56, which decodes encoded data that is retrieved from device 24. The ECC encoder and decoder operate in accordance with an incremental encoding scheme, as will be explained in detail below.

MSP 40 communicates with a host 60, for accepting data for storage in the memory device and for outputting data retrieved from the memory device. MSP 40, and in particular unit 48, may be implemented in hardware. Alternatively, MSP 40 may comprise a microprocessor that runs suitable software, or a combination of hardware and software elements. Typically, MSP 40 comprises a general-purpose processor, which is programmed in software to carry out the functions described herein. The software may be downloaded to the processor in electronic form, over a network, for example, or it may alternatively be supplied to the computer on tangible media, such as CD-ROM.

The configuration of FIG. 1 is an exemplary system configuration, which is shown purely for the sake of conceptual clarity. Any other suitable memory system configuration can also be used. Elements that are not necessary for understanding the principles of the present invention, such as various interfaces, addressing circuits, timing and sequencing circuits and debugging circuits, have been omitted from the figure for clarity.

In the exemplary system configuration shown in FIG. 1, memory device 24 and MSP 40 are implemented as two separate Integrated Circuits (ICs). In alternative embodiments, however, the memory device and MSP may be integrated on separate semiconductor dies in a single Multi-Chip Package (MCP) or System on Chip (SoC). Further alternatively, some or all of the MSP circuitry may reside on the same die on which the memory array is disposed. Further alternatively, some or all of the functionality of MSP 40 can be implemented in software and carried out by a processor or other element of the host system. In some implementations, a single MSP 40 may be connected to multiple memory devices 24.

Memory cells 32 of array 28 are typically arranged in a grid having multiple rows and columns, commonly referred to as word lines and bit lines, respectively. The array is typically divided into multiple pages, i.e., groups of memory cells that are programmed and read simultaneously. Pages are sometimes sub-divided into sectors. In some embodiments, each page comprises an entire row of the array. In alternative embodiments, each row (word line) can be divided into two or more pages. Cells are typically erased in groups of word lines that are referred to as erasure blocks.

Incremental Redundancy Schemes

Errors in the data stored in memory cells 32 are typically caused by various distortion mechanisms, such as cell aging, cross-coupling interference from other cells, disturb noise caused by operations on other cells, and many others. In many practical scenarios, different groups of memory cells (e.g., pages) experience different levels of distortion. Moreover, the level of distortion often changes over the life cycle of the memory device. In other scenarios, different groups of memory cells store data at different densities, using different numbers of programming levels. Higher-density cells are typically more sensitive to distortion than lower-density cells. Moreover, different groups of memory cells may store data having different error performance requirements.

Thus, the desired error correction capability of ECC decoder 56 often varies from one group of cells to another, as well as over time. In order for the ECC decoding process to reconstruct the data properly, the actual error correction capability of the ECC should at least match the desired level. An excessively low error correction capability will result in decoding failure. An excessively high error correction capability may waste system resources and cause unnecessarily high latency and/or increased power consumption. The desired error correction capability may be unknown at the time the cells are programmed, and sometimes remains unknown until decoding is actually attempted.

In view of the variable nature of the desired ECC error correction capability, embodiments of the present invention provide improved error correction schemes for memory devices. The methods and systems described herein match the actual error correction capability of the ECC decoding process to the desired level, so as to optimize the use of system resources and minimize performance degradation.

In the context of the present patent application and in the claims, terms such as "error correction capability," "decoding level" or "decoding performance level" refer to any quantitative measure of the ability of the ECC to correct errors. Such measures may comprise, for example, a maximum number of errors that the ECC is capable of correcting in a block of data of a given size, a maximum error burst size that is correctable by the ECC, a maximum input Bit Error Rate (BER) that is correctable by the ECC so as to read a given target output BER, or any other suitable measure.

The methods and systems described herein apply error correction in an incremental manner. In the disclosed schemes, MSP 40 encodes the data for storage in the memory cells with an Error Correction Code (ECC) that lends itself to incremental decoding, i.e., an ECC that is decodable using varying amounts of redundancy. When retrieving data from the memory cells, the MSP initially attempts to decode the ECC using a certain amount of redundancy, and increases the amount of redundancy if the initial decoding attempt fails. Thus, resources associated with ECC decoding (e.g., time, computational complexity and storage capacity) are used only to the extent necessary. Adverse effects of high-performance ECC decoding (e.g., increased latency and power consumption) are minimized, since the actual ECC error correction capability is optimized to the currently-desired level.

In accordance with the methods described herein, the encoded data is partitioned into two or more sections. The error correction scheme is designed so that the ECC can be decoded at a basic error correction capability using only the first section. Each additional section provides additional redundancy and increases the ECC decoding performance. When retrieving data from the memory cells, the MSP initially attempts to decode the ECC using only the first section of the encoded data. If the initial decoding attempt fails, the MSP re-attempts to decode the ECC using additional sections.

Several types of ECC can be used in incremental encoding schemes. For example, Bose-Chaudhuri-Hocquenghem (BCH) codes can be decoded at various error correction capabilities using different subsets of the redundancy bits. As another example, incremental encoding can be implemented using various puncturing methods that are well known in the art. Code puncturing methods typically remove some of the redundancy bits of from the encoded data, in order to reduce the code rate at the expense of decoding performance. An incremental encoding scheme can be implemented by using the punctured codewords as the first section, and re-introducing some or all of the punctured redundancy bits to form the additional sections. As yet another example, the data can be encoded using two or more ECCs, so as to generate multiple sets of redundancy bits having incrementally-increasing error correction capabilities. Thus, an incremental encoding scheme can be implemented using any suitable ECC that is decodable using different numbers of redundancy bits at different, respective error correction capabilities.

The embodiments described herein mainly address systematic codes, i.e., codes that add redundancy bits without modifying the uncoded data bits. However, the methods and systems described herein can similarly be used with non-systematic codes. When using systematic codes, the first section of the encoded data typically comprises the data bits and a subset of the redundancy bits. Each additional section comprises an additional subset of the redundancy bits. When using non-systematic codes, there is no distinction between uncoded bits and redundancy bits in the encoded data, and each section comprises a portion of the encoded data. The different sections are also referred to herein as redundancy sets.

The embodiments described herein assume that data is written and read in memory pages, and that each memory page is encoded separately using an incremental scheme. However, the methods and systems described herein can be used to encode and decode data for storage in any other suitable group of memory cells, such as sectors within a page, groups of pages or even entire erasure blocks.

In some embodiments, array 28 is partitioned into a data storage area and a redundancy storage area. The data storage area is used for storing the first sections of the encoded data, and the redundancy storage area is used for storing the additional redundancy sections. Thus, ECC decoding at the basic error correction capability can be performed using the encoded data retrieved from the data storage area only. When higher decoding performance is needed, additional encoded data can be read from the redundancy storage area.

Figure 2:
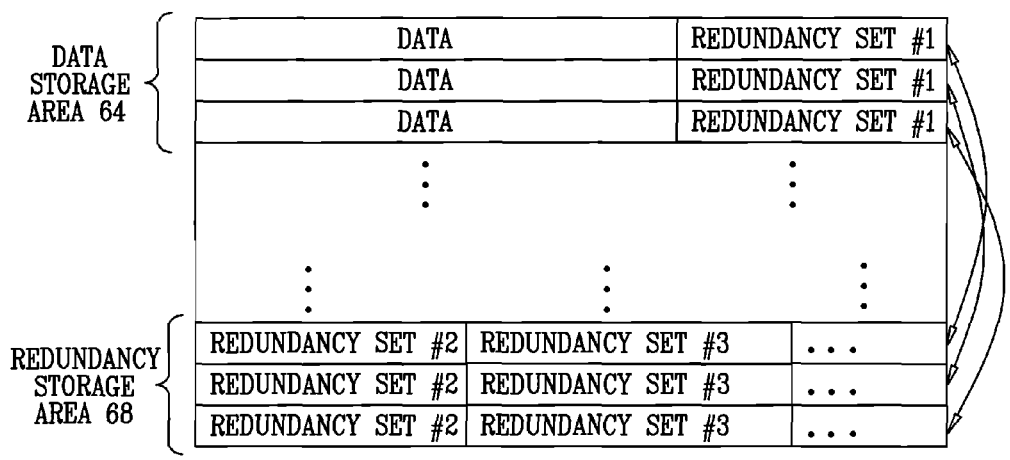
FIG. 2 is a schematic illustration of a memory array partitioned into a data storage area and a redundancy storage area, in accordance with an embodiment of the present invention.

FIG. 2 is a schematic illustration of memory array 28, in accordance with an embodiment of the present invention. In the present example, array 28 is partitioned into a data storage area 64 and a redundancy storage area 68. Memory pages are represented by rows in the figure. Each page in data storage area 64 stores the first section of a given data item, which comprises the data bits and a first set of redundancy bits. For each page in data storage area 64, a corresponding page in redundancy storage area 68 stores additional redundancy sets, i.e., additional sets of redundancy bits that enable higher-performance decoding of the ECC.

Since the first redundancy set is stored in the same page as the data, MSP 40 can decode the ECC at the basic error correction capability by performing a single read operation. Additional read operations, which retrieve additional redundancy sets from the redundancy storage area, are carried out only when necessary.

Figure 4:
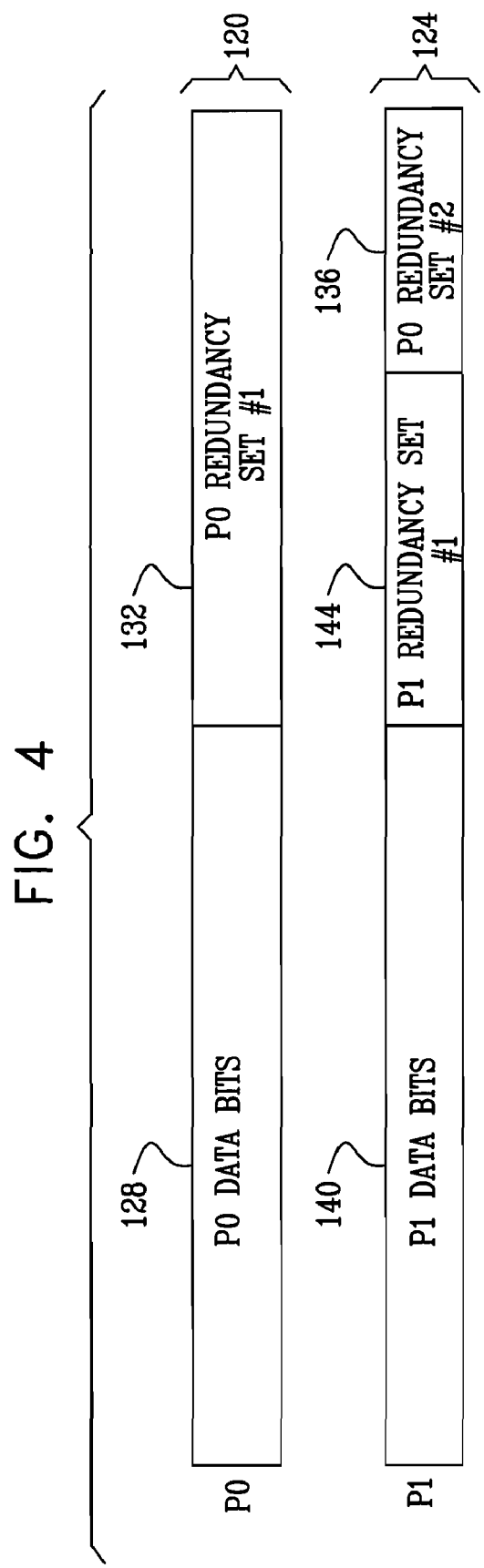
FIG. 4 is a schematic illustration of memory pages that store data and redundancy bits, in accordance with an embodiment of the present invention.

In the example of FIG. 2, data storage area 64 and redundancy storage area 68 comprise separate contiguous groups of pages, which occupy separate areas of the memory array. In alternative embodiments, however, areas 64 and 68 may be non-contiguous. For example, the two areas may occupy pages or word lines that are interleaved with one another. Further alternatively, a given page may store data bits, as well as redundancy bits that are related to the data of another page. Such a configuration is shown in FIG. 4 below.

Figure 3:
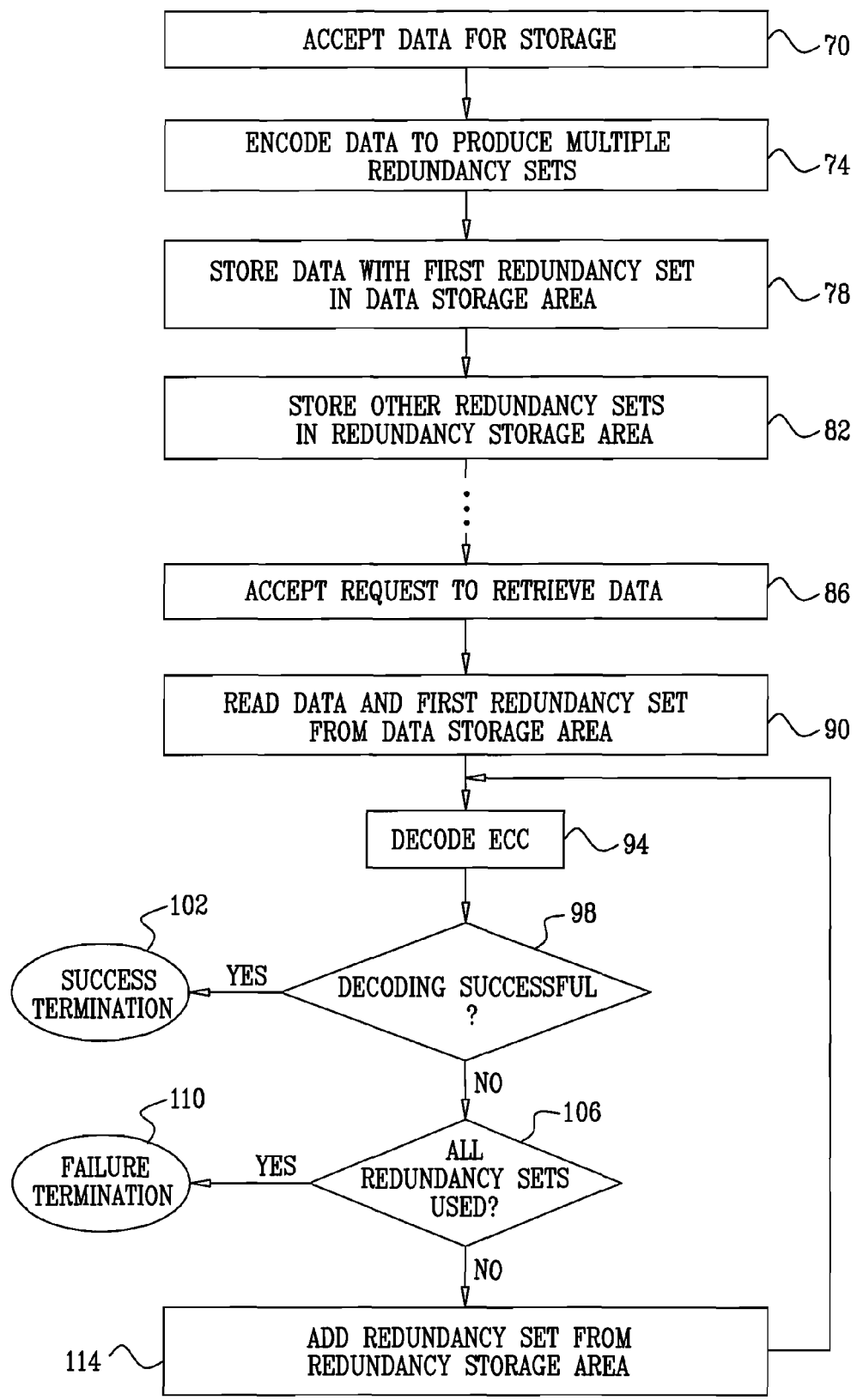
FIG. 3 is a flow chart that schematically illustrates a method for data storage and retrieval using incremental redundancy, in accordance with an embodiment of the present invention.

FIG. 3 is a flow chart that schematically illustrates a method for data storage and retrieval using incremental redundancy, in accordance with an embodiment of the present invention. The method begins with MSP 40 accepting data for storage from host 60, at an input step 70. ECC encoder 52 in the MSP encodes the data to produce multiple redundancy sets, at an encoding step 74. The ECC encoder may apply any suitable ECC and may produce encoded data comprising any desired number of redundancy sets. MSP 40 stores the first section of the encoded data in the data storage area, at a first storage step 78. The MSP stores the other sections of the encoded data in the redundancy storage area, at a second storage step 82. When the ECC comprises a systematic code, the first section comprises the data bits and the first redundancy set.

At some point in time after storing the data, the MSP accepts a request from host 60 to retrieve the data, at a request acceptance step 86. In response to the request, the MSP reads the first section of the encoded data (e.g., the data bits and first redundancy set) from the data storage area, at a first reading step 90. ECC decoder 56 in the MSP attempts to decode the ECC using the first section of the encoded data, at a decoding step 94. If decoding is successful, as checked by a success checking step 98, the method terminates at a success termination step 102. The MSP reconstructs the decoded data and provides the reconstructed data to host 60.

Otherwise, i.e., when ECC decoding was not successful, the MSP checks whether there are remaining redundancy sets that can be used, at a remaining redundancy checking step 106. If all redundancy information was used already, the method terminates without successfully reconstructing the data, at a failure termination step 110.

If, on the other hand, there are remaining redundancy sets, the MSP reads from the redundancy storage area an additional redundancy set that was not yet used, at a redundancy adding step 114. The method then loops back to decoding step 94 above, and ECC decoder 56 attempts to re-decode the ECC using the different redundancy sets that have been retrieved so far. The method of FIG. 3 continues iteratively. MSP 40 attempts to decode the ECC using an increasing number of redundancy sets, until decoding is successful or until all redundancy sets have been read and used.

In some incremental redundancy schemes, the decoder assumes that the redundancy bits (redundancy sets) themselves are substantially error-free. In such cases, the MSP may encode each redundancy set using another ECC, so that the reliability of decoding the redundancy sets is sufficiently high to ensure satisfactory operation of the incremental decoding process.

In some embodiments, the different redundancy sets are stored without partitioning the memory array into separate data and redundancy storage areas. For example, a memory page whose data is encoded with relatively little redundancy may have some unused memory cells. These spare cells can be used to store redundancy bits of another page, whose data is encoded with a higher redundancy level.

FIG. 4 is a schematic illustration of memory pages that store data and redundancy bits, in accordance with an embodiment of the present invention. The figure shows two memory pages 120 and 124, respectively denoted P0 and P1. In the present example, the data of page P0 is decoded with a higher redundancy level than the data of page P1. The two pages may be encoded with different redundancy levels because page P0 suffers from higher distortion in comparison with page P1, because page P0 has a higher storage density and is therefore more sensitive to distortion, because the data in page P0 is identified as sensitive, or for any other reason.

Page P0 stores data bits 128, which are encoded to produce a first redundancy set 132 and a second redundancy set 136. Page P1 stores data bits 140, which are encoded to produce only a first redundancy set 144. Because page P1 comprises only one redundancy set, it has some unused memory cells. These spare cells are used for storing the second redundancy set of page P0.

The data retrieval process is different for page P0 and for page P1. In order to retrieve the data from page P1, the MSP reads the cells of page P1 and decodes the ECC using redundancy set 144. In order to retrieve the data from page P0, the MSP initially reads the cells of page P0 and attempts to decode the ECC using the first redundancy set 132. If decoding is successful, the MSP reconstructs and outputs the data. Otherwise, the MSP reads the cells of page P1, and re-attempt to decode the ECC, this time using both the first redundancy set 132 and the second redundancy set 136.

Increasing Redundancy During the Life Cycle of the Memory Device

As explained above, the desired error correction capability of the ECC decoder may change during the life cycle of the memory device, sometimes in a manner that is difficult to predict in advance. For example, the storage values in a given group of cells may drift due to cell aging. Storage values may be distorted due to disturb noise or cross-coupling interference that are generated after the cells have been programmed. Such changes may occur minutes, days or even years after programming the cells.

In some embodiments of the present invention, MSP 40 increases the amount of ECC redundancy of a given data item after the data has been stored. For example, the MSP may read a given page, decode the ECC and determine the number of corrected errors in the page. If the number of corrected errors exceeds a certain tolerable level, the MSP produces and stores additional redundancy bits associated with the page. Alternatively, the MSP may decide to produce and store additional redundancy bits in response to any other suitable criterion. For example, the MSP may estimate the level of distortion in the page in question, and decide to generate and store additional redundancy bits if the distortion level exceeds a certain tolerable threshold. Methods for estimating distortion levels in memory cells are described, for example, in PCT Application WO 2007/132453, entitled "Distortion Estimation and Cancellation in Memory Devices," filed May 10, 2007, and in PCT Application PCT/IL2007/001059, entitled "Estimation of Non-Linear Distortion in Memory Devices," filed Aug. 27, 2007, whose disclosures are incorporated herein by reference. The MSP may use any of these techniques, or any other suitable technique, for estimating the distortion level and determining whether or not to add redundancy bits.

Additional redundancy can be introduced using various means that do not necessarily involve additional encoding operations. For example, when the MSP determines that the number of errors in a given page exceeds a certain tolerable level, the MSP may store the indices or locations of the erred bits in the memory as a form of additional redundancy. When reading the page, the MSP may query the stored indices and correct some or all of the previously-discovered errors. The stored indices may be compressed by the MSP in order to reduce memory overhead. Techniques of this sort are described, for example, in U.S. patent application Ser. No. 11/957,970, entitled "High-Speed Programming of Memory Devices," filed Dec. 17, 2007, whose disclosure is incorporated herein by reference. Thus, in the context of the present patent application and in the claims, terms such as "ECC" and "encoded data" are used in a broad sense to refer to any computation method that produces redundancy information, such as storing indices of erred bits or any other information regarding previously-discovered errors.

Introducing additional redundancy during the life cycle of the device is sometimes more memory-efficient and computationally-efficient than the method of FIG. 3 above. In the method of FIG. 3, the MSP encodes the data with the worst-case redundancy level a-priori. All of the redundancy information is computed and stored in array 28, regardless of whether or not it will be used in reading the data. In contrast, when additional redundancy is introduced during the life cycle of the device, additional computations are performed and additional memory space is used only when necessary, e.g., when the expected number of errors in a given page approaches intolerable levels.

Figure 5:
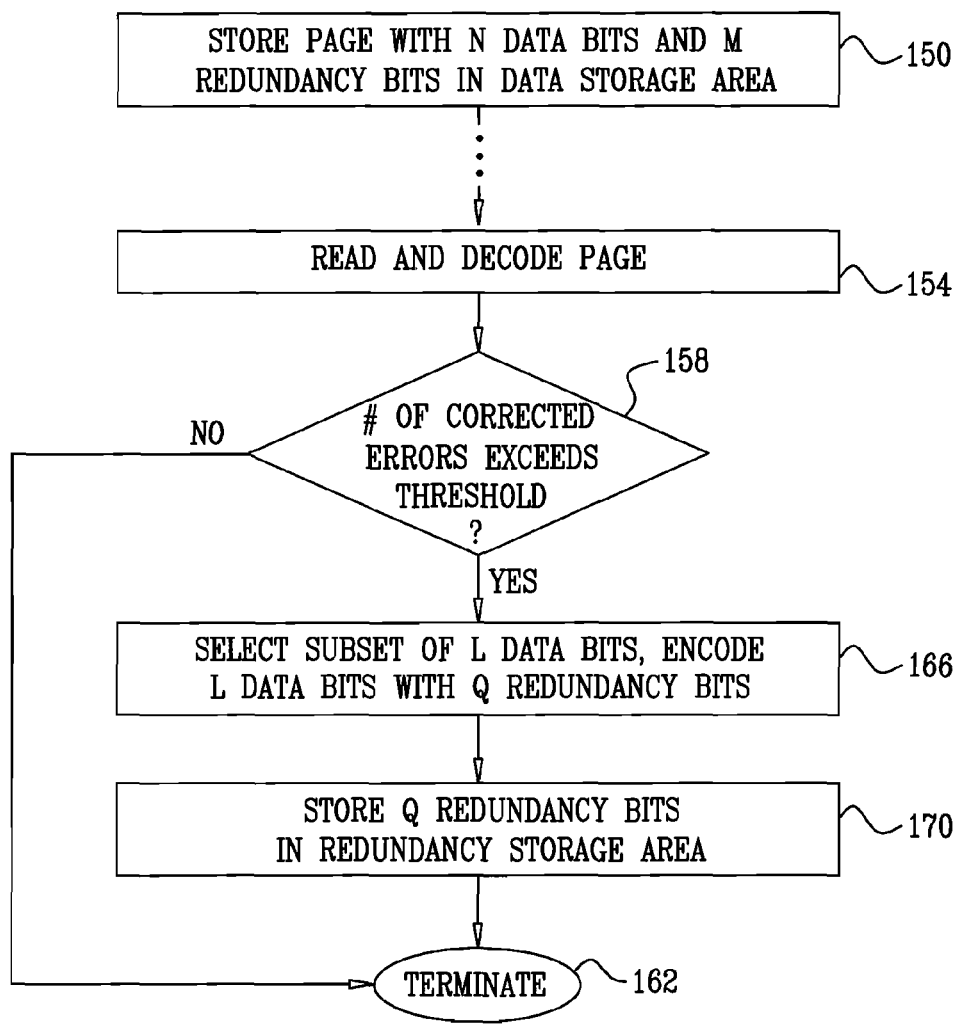
FIG. 5 is a flow chart that schematically illustrates a method for data storage using incremental redundancy, in accordance with an alternative embodiment of the present invention.

FIG. 5 is a flow chart that schematically illustrates a method for data storage using incremental redundancy, in accordance with an embodiment of the present invention. The method begins with MSP 40 encoding a page of N data bits with an ECC that produces M redundancy bits. For example, the page may have N=32768 data bits and M=1024 redundancy bits, although any other suitable values can also be used. The ECC is capable of correcting up to K errors in the page. The MSP stores the encoded data in the data storage area, at an initial storage step 150.

At some point in time after the page was stored, the MSP is requested to retrieve the data. The MSP reads the page from the data storage area and decodes the ECC, at an initial decoding step 154. The MSP determines the number of errors that were corrected by the ECC, and checks whether this number exceeds a certain predetermined threshold, at an error checking step 158. The number of corrected errors is typically reported by ECC decoder 56 at step 154.

The threshold typically depends on (and is typically smaller than) K, the correction capability of the code. As long as the number of errors in the page is smaller than K, the ECC decoder is capable of successfully reconstructing the data. When the number of errors approaches and exceeds K, the decoder may fail.

If the number of corrected errors is lower than the threshold, the method terminates, at a termination step 162. In this case, the MSP concludes that the current redundancy level is sufficient. If, on the other hand, the number of corrected errors exceeds the threshold, the MSP adds redundancy bits at a redundancy adding step 166, and stores the added redundancy bits in the redundancy storage area at an additional storage step 170.

In the present example, the MSP adds redundancy bits by selecting a subset of L data bits from among the N data bits of the page, and encoding the L data bits to produce Q redundancy bits. The MSP stores the Q redundancy bits in the redundancy storage area. The ECC used for encoding the L data bits at step 166 may comprise the same ECC used for encoding the N data bits at step 150 above, or a different ECC. The ECC used at step 166 is capable of correcting J errors in the L data bits.

Figure 6:
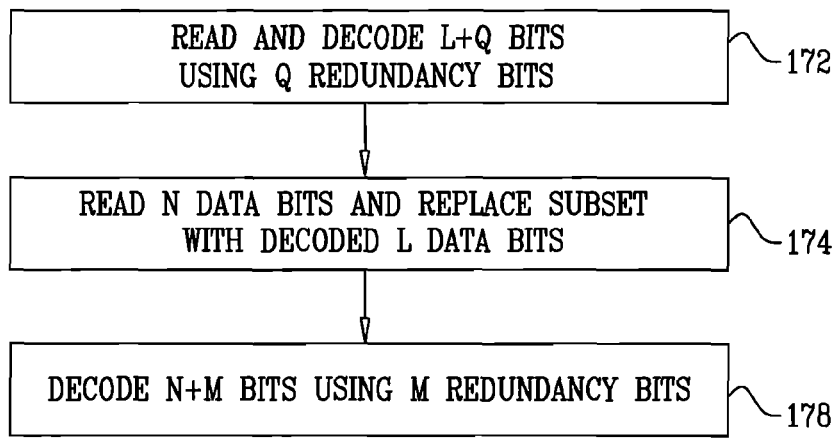
FIG. 6 is a flow chart that schematically illustrates a method for retrieval of data that has been stored using the method of FIG. 5, in accordance with an embodiment of the present invention.

FIG. 6 is a flow chart that schematically illustrates a method for retrieval of data that has been stored using the method of FIG. 5, in accordance with an embodiment of the present invention. The method begins with MSP 40 reading and decoding the L+Q bits (L data bits and Q redundancy bits) using the Q redundancy bits, at a first decoding step 172. The ECC used at step 172 is the same ECC used for encoding at step 166 of FIG. 5. The MSP then reads the N data bits of the page and replaces the subset of L bits of the read page with the corrected L bits, at a replacement step 174. The MSP then decodes the N+M bits (N data bits and M redundancy bits) using the M redundancy bits, at a second decoding step 178.

The following numerical example demonstrates the effectiveness of the methods of FIGS. 5 and 6. Consider a sector that stores N=4096 data bits and M=130 redundancy bits. In the present example, the N data bits were encoded with a BCH code that is capable of correcting up to K=10 errors in the sector. When the number of corrected errors in the sector approaches the threshold, the reliability of the sector can be increased by choosing a subset of L=1024 bits (a quarter of the sector) and encoding these 1024 bits by another ECC to produce Q=110 redundancy bits. The second ECC is capable of correcting up to J=10 errors in the subset of L=1024 bits in the sector.

The threshold at step 158 of FIG. 5 is set in this example to six errors. When the number of corrected errors exceeds this threshold, a subset of one quarter of the sector is selected and encoded with another ECC. The subset of L=1024 bits can be selected in different ways. For example, the sector can be divided into four quarters, and the MSP may select the quarter having two or three errors. The selected quarter is then encoded with Q=110 redundancy bits.

Having produced and stored the additional Q=110 redundancy bits, errors can still be corrected even when their number increases to nine (a number that exceeds the K=10 correction capability of the first ECC). In order to do so, the second ECC is first decoded to correct the L=1024 bits using the Q=110 redundancy bits. This step corrects at least two of the nine errors, since the L=1024 bits were selected as containing at least two errors. By replacing the L=1024 bits with the corrected bits, the total number of errors within the N=4096 bits is reduced to seven, and these remaining errors are within the correction capability of the first ECC (using the M=130 redundancy bits).

The methods of FIGS. 5 and 6 can be used with any suitable values of N and M. The N bits may correspond to a sector (e.g., 512 bytes), a page (e.g., 2K or 4K bytes), a multi-page in a multi-plane configuration, a group of pages, a word line or even an entire erasure block. The redundancy ratio (i.e., the ratio between N and M) may also be selected as desired.

In the description above, MSP 40 begins with reading and decoding the additional redundancy (L+Q) bits. In some embodiments, however, the MSP may initially attempt to decode the N+M bits without decoding the L+Q bits, and revert to using the L+Q bits only if the initial attempt fails. In other words, referring to FIG. 6, the MSP may initially perform step 178 without performing steps 172 and 174, and revert to carrying out the full method of FIG. 6 upon failing to decode the N+M bits based on the M redundancy bits.

Redundancy Allocation Based on Page Verification Results

In many memory devices, the cells are programmed using an iterative Program and Verify (P&V) process, as is known in the art. In a typical P&V process, the cells of a given page are programmed by a sequence of incrementally-increasing programming pulses. After each programming iteration, the storage values of the cells are verified, and programming is continued for only the cells that have not yet reached their intended target levels.

In some embodiments, R/W unit 36 programs cells 32 using a P&V process. Each verification operation inherently reads the storage values that were written to the cells. The MSP uses the read storage values to assess the expected storage reliability of the page, such as by estimating the distortion level in the cells, by estimating statistical characteristics of the storage values, or using any other suitable technique. The MSP allocates additional redundancy to the page, so as to match the estimated reliability of the page.

Figure 7:
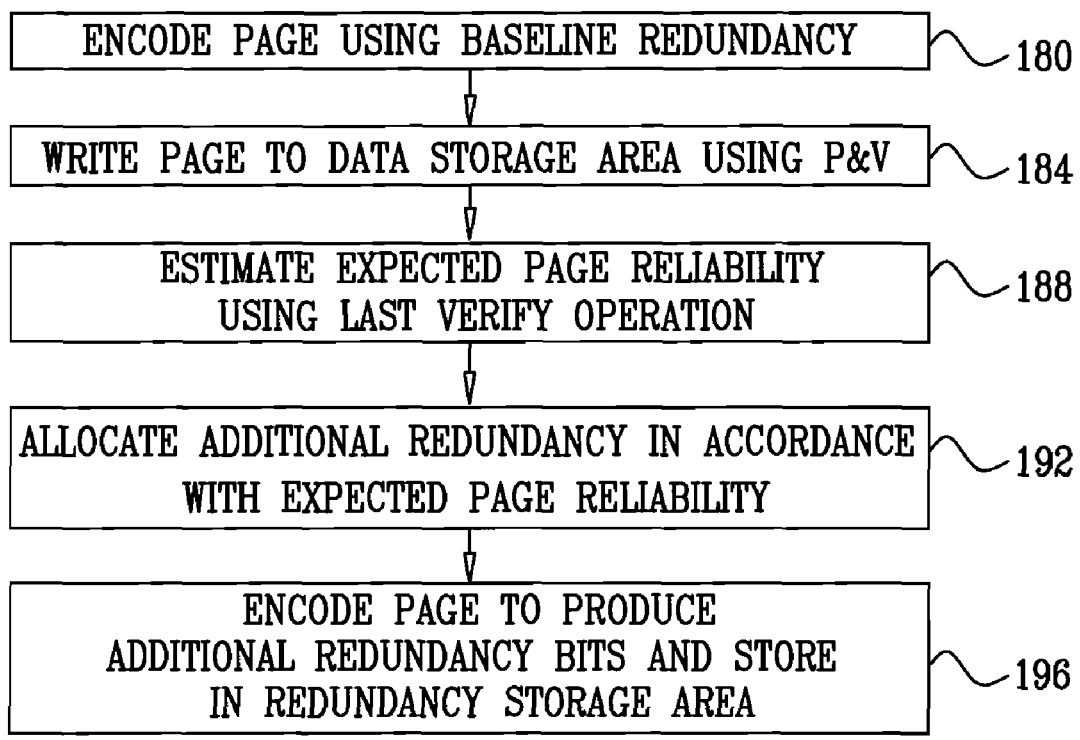
FIG. 7 is a flow chart that schematically illustrates a method for data storage and retrieval using incremental redundancy, in accordance with another embodiment of the present invention.

FIG. 7 is a flow chart that schematically illustrates a method for data storage and retrieval using incremental redundancy, in accordance with another embodiment of the present invention. The method begins with MSP 40 encoding a page of data with a predetermined baseline redundancy level, at a baseline programming step 180. Typically although not necessarily, the baseline redundancy level is designed to provide limited error correction capability, to be used by pages having little or no distortion.

The MSP stores the page that was encoded with the baseline redundancy level using a P&V process, at a P&V storage step 184. As part of the P&V process, the R/W unit reads the storage values from the programmed page, and can make this information available to the MSP. The MSP estimates an expected storage reliability of the page based on the read storage values, at a reliability estimation step 188. Typically, the MSP estimates the page reliability based on the storage values read in the last verification iteration. Alternatively, however, the MSP may process storage values from another P&V iteration, or from a number of iterations.

The MSP may compute a reliability metric based on the read storage values of the page. The page reliability metric may indicate the expected number of errors in the page under certain assumptions, e.g., under worst-case distortion assumptions. The MSP may estimate the distortion level in the cells of the page and may compute the metric based on the estimated distortion. In some embodiments, the MSP may read the cells several times (and/or use the verification results from several P&V iterations), and compute a soft metric based on the multiple read results.

Methods for estimating distortion that can be used by the MSP for this purpose are described, for example, in PCT Application WO 2007/132453 and in PCT Application PCT/IL2007/001059, cited above. Methods for computing soft metrics based on multiple read results are described, for example, in PCT Application WO 2007/132457, entitled "Combined Distortion Estimation and Error Correction Coding for Memory Devices," filed May 10, 2007, and in U.S. patent application Ser. No. 11/995,814, entitled "Reading Memory Cells using Multiple Thresholds," filed Jan. 15, 2008, whose disclosures are incorporated herein by reference.

The MSP determines, based on the page reliability metric, whether the baseline redundancy level is sufficient for reliably decoding the page data, or whether additional redundancy is desirable.

If the MSP determines that the baseline redundancy level is insufficient, the MSP allocates additional redundancy to the page based on the estimated page reliability, at an additional allocation step 192. In some embodiments, the amount of additional redundancy (e.g., the code rate and/or the number and sizes of added redundancy sets) depends on the metric value of the page. If allocated, the MSP encodes some or all of the data in the page to produce the additional redundancy bits, and stores the additional redundancy bits, at an additional redundancy storage step 196.

In embodiments in which the memory is partitioned into a data storage area and a redundancy storage area, the page that is encoded at the baseline redundancy level is stored in the data storage area, and the additional redundancy bits are stored in the redundancy storage area. Typically, the MSP records the amount of redundancy allocated to the page and/or the locations in which the data and redundancy bits are stored, such as in a designated group of cells 32 or in a memory of the MSP.

Retrieval of the page can be carried out using all of the redundancy information pertaining to the page, or in an incremental manner (such as in accordance with steps 86-114 of the method of FIG. 3 above). When using the method of FIG. 7, the MSP allocates each page an amount of redundancy that matches its expected reliability.

In some embodiments, the MSP may adapt the maximum or actual number of P&V iterations based on the page reliability metric. For example, the MSP may compute the page reliability metric after each P&V iteration, and stop the iterative P&V process when the metric reaches a predetermined value. As another example, the MSP may modify the maximum allowed number of P&V iterations based on the page reliability metric. In these embodiments, the MSP computes the metric after the P&V process terminates or after a number of P&V iterations. Based on the metric, the MSP may decide to increase or decrease the maximum number of P&V iterations to be allowed in subsequent programming operations of the page. As yet another example, the MSP may initially set a certain maximum number of P&V iterations as default, and use this value for programming the cells. If the MSP determines, based on the verification read results, that this default number is insufficient, the MSP may increase the default number for subsequent programming operations. The maximum number of iterations may apply to any suitable group of cells, such as a page, part of a page, a sector, an erasure block or even to a single cell.

In alternative embodiments, the MSP may compute the page reliability metric at any desired time after the page was programmed, and not necessarily during or immediately after programming. For example, the MSP may read the page and estimate its reliability seconds, minutes or even years after the page was programmed. Further alternatively, the methods described above are not limited to P&V processes. For example, in configurations in which the cells are programmed without verification, the MSP may carry out dedicated read operations at any desired time in order to estimate the page reliability.

In the embodiments described herein, the MSP initially attempts to reconstruct the data using some initial redundancy, and decides to use additional redundancy in response to a failure to decode the ECC based on the initial redundancy. In alternative embodiments, however, the use of additional redundancy can be triggered by other kinds of conditions. Such conditions are typically defined with respect to the memory cells in which the data (and possibly the initial redundancy bits) are stored.

As already explained above, the MSP may decide to use additional redundancy when the estimated level of distortion in the relevant cells exceeds a certain tolerable level. As another example, the MSP may accept information regarding the reliability or quality of certain areas of the memory. Such information can be measured, for example, during testing of the device in production and provided to the MSP by a production line tester. When a certain area of the memory (e.g., a certain block) is identified during production as less reliable, the MSP may decide to use additional redundancy for the data stored in this block. Additionally or alternatively, the condition may be defined a-priori with respect to certain locations in the memory. For example, certain areas of the memory (e.g., the first and last word lines in a block) may be characterized by poorer reliability. In such cases, the MSP may decide to use additional redundancy for data stored in these predefined locations. As yet another example, the condition may refer to the age or wear of the cells. In other words, the MSP may decide to use additional redundancy for data that has been stored for a long time period, and/or for data stored in cells that have gone though a large number of programming and erasure cycles.

Although the embodiments described herein mainly address data storage and retrieval in solid-state memory devices, the principles of the present invention can also be used for storing and retrieving data in Hard Disk Drives (HDD) and other data storage media and devices. Although the embodiments described herein mainly refer to non-volatile analog memory cells, the methods and systems described herein can be applied to digital memory cells such as NOR cells or Phase Change Memory (PCM) cells, to volatile memory cells such as Dynamic Random Access Memory (DRAM) cells, as well as to digital memory cells such as Static RAM (SRAM) cells.

It will thus be appreciated that the embodiments described above are cited by way of example, and that the present invention is not limited to what has been particularly shown and described hereinabove. Rather, the scope of the present invention includes both combinations and sub-combinations of the various features described hereinabove, as well as variations and modifications thereof which would occur to persons skilled in the art upon reading the foregoing description and which are not disclosed in the prior art.

The invention claimed is:

1. A method for operating a memory that includes a plurality of memory cells, comprising:
encoding input data with an Error Correction Code (ECC) so as to produce input encoded data comprising first and second sections, such that the ECC is decodable with a first error correction capability when decoded only based on the first section, and is decodable with a second error correction capability, higher than the first error correction capability, when decoded based on both the first and the second sections;
storing the input encoded data in the memory cells;
after storing at least part of the input encoded data, reading from the memory cells output encoded data; and
evaluating a condition related to the output encoded data and reconstructing the input data using a decoding level selected, responsively to the evaluated condition, from a group of decoding levels consisting of:
a first decoding level, at which a first part of the output encoded data corresponding to the first section of the input encoded data is processed so as to decode the ECC with the first error correction capability; and
a second decoding level, at which both the first part and a second part of the output encoded data corresponding to the second section of the input encoded data are processed jointly so as to decode the ECC with the second error correction capability.

2. The method according to claim 1, wherein the condition comprises a failure to reconstruct the input data with the first error correction capability.

3. The method according to claim 1, wherein evaluating the condition comprises estimating a distortion level in the memory cells in which the first part is stored, and wherein the condition is defined with respect to the estimated distortion level.

4. The method according to claim 1, wherein storing the input encoded data comprises partitioning the plurality of the memory cells into a data storage area and a redundancy storage area different from the data storage area, storing the first section in the data storage area and storing the second section in the redundancy storage area.

5. The method according to claim 1, wherein reading the output encoded data comprises reading the first part from the memory cells in a single read operation, and reading the second part in another read operation.

6. The method according to claim 1, wherein storing the input encoded data comprises storing the first and second sections in the memory cells before reading the output encoded data.

7. The method according to claim 1, wherein encoding the input data comprises producing the second section responsively to processing the first part of the output encoded data.

8. The method according to claim 1, wherein the first section comprises uncoded data bits, wherein encoding the data comprises selecting a subset of the uncoded data bits from the first section and encoding the selected subset to produce redundancy bits, and wherein the second section comprises the redundancy bits.

9. The method according to claim 8, wherein reconstructing the input data using the second decoding level comprises decoding the redundancy bits in the second part so as to reconstruct the subset of the uncoded data bits, replacing the subset of the uncoded data bits in the first part with the reconstructed subset of the uncoded data bits, and decoding the first part, including the replaced subset, so as to reconstruct the input data.

10. The method according to claim 1, wherein reconstructing the input data using the first decoding level comprises determining a number of errors that were corrected by the ECC with the first error correction capability and comparing the number to a threshold, and wherein encoding the input data comprises producing and storing the second section responsively to the number exceeding the threshold.

11. The method according to claim 10, wherein producing and storing the second section comprise storing in the second section locations in the memory of bits in which the errors that were corrected by the ECC are located.

12. The method according to claim 1, wherein encoding the input data comprises encoding redundancy bits produced by the ECC in at least one of the first and second sections with an additional ECC.

13. The method according to claim 1, wherein the memory cells comprise analog memory cells.

14. The method according to claim 13, wherein storing the input encoded data comprises writing storage values that represent the data in the first section to a group of the analog memory cells and verifying the written storage values, and wherein encoding the data comprises estimating a storage reliability of the group and producing the second section responsively to the estimated storage reliability.

15. The method according to claim 14, wherein writing and verifying the storage values comprise applying a sequence of programming iterations to the analog memory cells in the group, and determining a number of the programming iterations in the sequence based on the estimated storage reliability.

16. The method according to claim 1, wherein encoding the input data comprises measuring a distortion in the memory cells, and producing the second section only responsively to determining that the first section is insufficient for decoding the ECC in the presence of the distortion.

17. The method according to claim 1, wherein the condition is defined with respect to a location in the memory of the memory cells in which the first part is stored.

18. The method according to claim 1, and comprising accepting a reliability indication regarding the memory cells in which the first part is stored, wherein the condition is defined with respect to the reliability indication.

19. A data storage apparatus, comprising:
an interface, which is operative to communicate with a memory that includes a plurality of memory cells; and
a processor, which is connected to the interface and is coupled to encode input data with an Error Correction Code (ECC) so as to produce input encoded data comprising first and second sections, such that the ECC is decodable with a first error correction capability when decoded only based on the first section, and is decodable with a second error correction capability, higher than the first error correction capability, when decoded based on both the first and the second sections, to store the input encoded data in the memory cells, to read from the memory cells output encoded data after storing at least part of the input encoded data, to evaluate a condition related to the output encoded data and to reconstruct the input data using a decoding level selected, responsively to the evaluated condition, from a group of decoding levels consisting of:
a first decoding level, at which a first part of the output encoded data corresponding to the first section of the input encoded data is processed so as to decode the ECC with the first error correction capability; and
a second decoding level, at which both the first part and a second part of the output encoded data corresponding to the second section of the input encoded data are processed jointly so as to decode the ECC with the second error correction capability.

20. The apparatus according to claim 19, wherein the condition comprises a failure to reconstruct the input data with the first error correction capability.

21. The apparatus according to claim 19, wherein the processor is coupled to estimate a distortion level in the memory cells in which the first part is stored, and wherein the condition is defined with respect to the estimated distortion level.

22. The apparatus according to claim 19, wherein the processor is coupled to partition the plurality of the memory cells into a data storage area and a redundancy storage area different from the data storage area, to store the first section in the data storage area and to store the second section in the redundancy storage area.

23. The apparatus according to claim 19, wherein the processor is coupled to read the first part from the memory cells in a single read operation, and to read the second part in another read operation.

24. The apparatus according to claim 19, wherein the processor is coupled to store the first and second sections in the memory cells before reading the output encoded data.

25. The apparatus according to claim 19, wherein the processor is coupled to produce the second section responsively to reconstructing the input data using the first decoding level.

26. The apparatus according to claim 19, wherein the first section comprises uncoded data bits, wherein the processor is coupled to select a subset of the uncoded data bits from the first section and to encode the selected subset to produce redundancy bits, and wherein the second section comprises the redundancy bits.

27. The apparatus according to claim 26, wherein the processor is coupled to decode the redundancy bits in the second part so as to reconstruct the subset of the uncoded data bits, to replace the subset of the uncoded data bits in the first part with the reconstructed subset of the uncoded data bits, and to decode the first part, including the replaced subset, so as to reconstruct the input data.

28. The apparatus according to claim 19, wherein the processor is coupled to determine a number of errors that were corrected by the ECC with the first error correction capability, to compare the number to a threshold and to produce and store the second section responsively to the number exceeding the threshold.

29. The apparatus according to claim 28, wherein the processor is coupled to store in the second section locations in the memory of bits in which the errors that were corrected by the ECC are located.

30. The apparatus according to claim 19, wherein the processor is coupled to encode redundancy bits produced by the ECC in at least one of the first and second sections with an additional ECC.

31. The apparatus according to claim 19, wherein the memory cells comprise analog memory cells.

32. The apparatus according to claim 31, wherein the processor is coupled to cause the memory device to write storage values that represent the data in the first section to a group of the analog memory cells and to verify the written storage values, and is further coupled to estimate a storage reliability of the group and to produce the second section responsively to the estimated storage reliability.

33. The apparatus according to claim 32, wherein the processor is coupled to cause the memory device to apply a sequence of programming iterations to the analog memory cells in the group so as to write the storage values, and is further coupled to determine a number of the programming iterations in the sequence based on the estimated storage reliability.

34. The apparatus according to claim 19, wherein the processor is coupled to measure a distortion in the memory cells and to produce the second section only responsively to determining that the first section is insufficient for decoding the ECC in the presence of the distortion.

35. The apparatus according to claim 19, wherein the condition is defined with respect to a location in the memory of the memory cells in which the first part is stored.

36. The apparatus according to claim 19, wherein the processor is coupled to accept a reliability indication regarding the memory cells in which the first part is stored, and wherein the condition is defined with respect to the reliability indication.

37. A data storage apparatus, comprising:
  a memory, which comprises a plurality of memory cells; and
  a processor, which is coupled to encode input data with an Error Correction Code (ECC) so as to produce input encoded data comprising first and second sections, such that the ECC is decodable with a first error correction capability when decoded only based on the first section, and is decodable with a second error correction capability, higher than the first error correction capability, when decoded based on both the first and the second sections, to store the input encoded data in the memory cells, to read from the memory cells output encoded data after storing at least part of the input encoded data, to evaluate a condition related to the output encoded data and to reconstruct the input data using a decoding level selected, responsively to the evaluated condition, from a group of decoding levels consisting of:
  a first decoding level, at which a first part of the output encoded data corresponding to the first section of the input encoded data is processed so as to decode the ECC with the first error correction capability; and
  a second decoding level, at which both the first part and a second part of the output encoded data corresponding to the second section of the input encoded data are processed jointly so as to decode the ECC with the second error correction capability.

* * * * *